(12) United States Patent
Mizoguchi

(10) Patent No.: US 7,785,113 B2
(45) Date of Patent: Aug. 31, 2010

(54) ELECTRICAL CONNECTION STRUCTURE

(75) Inventor: Masanori Mizoguchi, Nerima-ku (JP)

(73) Assignee: Asahi Denka Kenkyusho Co., Ltd., Tokyo (JP)

( * ) Notice: Subject to any disclaimer, the term of this patent is extended or adjusted under 35 U.S.C. 154(b) by 247 days.

(21) Appl. No.: 11/885,262

(22) PCT Filed: Oct. 27, 2006

(86) PCT No.: PCT/JP2006/321534

§ 371 (c)(1),
(2), (4) Date: Aug. 28, 2007

(87) PCT Pub. No.: WO2008/050448

PCT Pub. Date: May 2, 2008

(65) Prior Publication Data

US 2009/0233465 A1    Sep. 17, 2009

(51) Int. Cl.
*H01R 12/00* (2006.01)
(52) U.S. Cl. .......................................... 439/67; 439/82
(58) Field of Classification Search .................. 439/67, 439/82, 65
See application file for complete search history.

(56) References Cited

U.S. PATENT DOCUMENTS

| | | | |
|---|---|---|---|
| 3,077,511 A * | 2/1963 | Bohrer et al. ................ 174/265 |
| 3,214,827 A * | 11/1965 | Prohofsky ..................... 29/830 |
| 3,541,223 A * | 11/1970 | Helms ........................ 174/262 |
| 3,541,225 A * | 11/1970 | Raciti ....................... 174/74 R |
| 3,795,047 A * | 3/1974 | Abolafia et al. ............... 29/843 |
| 3,859,711 A * | 1/1975 | McKiddy ..................... 29/593 |
| 4,394,712 A * | 7/1983 | Anthony ..................... 361/779 |
| 4,511,757 A * | 4/1985 | Ors et al. .................... 174/258 |
| 4,720,470 A * | 1/1988 | Johnson ...................... 438/598 |
| 4,929,185 A * | 5/1990 | Wong et al. ................... 439/74 |
| 5,030,110 A * | 7/1991 | Groves et al. ................. 439/69 |

(Continued)

FOREIGN PATENT DOCUMENTS

JP    63-246837 A    10/1988

(Continued)

*Primary Examiner*—T C Patel
*Assistant Examiner*—Vladimir Imas
(74) *Attorney, Agent, or Firm*—Cohen Pontani Lieberman & Pavane LLP

(57) ABSTRACT

An electrical connection structure allowing reduction in height and easy disassembly, wherein a first connecting member comprises a flexible substrate comprising a flexible insulating film, at least one conductive pad formed on at least one side thereof, a conductive circuit pattern extending from the rim of the pad, a through-hole formed through the thickness thereof at a planar position within the pad, and a small aperture formed at a planar position within the pad and communicating with the through-hole, and a second connecting member comprises a conductive projection formed at least one side thereof and electrically connected with a conductive circuit pattern formed inside or on the second connecting member, where the electrical connection is formed in the manner such that the conductive projection of the second connecting member is inserted in the through-hole of the first connecting member, through the small aperture in the pad, bending the pad and the portion of the insulating film under the pad, along the direction of insertion of the conductive projection, so that the pad is pressed onto the conductive projection due to elastic force of the pad and the insulating film bent.

15 Claims, 21 Drawing Sheets

U.S. PATENT DOCUMENTS

| | | | |
|---|---|---|---|
| 5,128,831 A * | 7/1992 | Fox et al. | 361/735 |
| 5,132,879 A * | 7/1992 | Chang et al. | 361/784 |
| 5,414,223 A * | 5/1995 | Suski et al. | 174/262 |
| 5,570,504 A * | 11/1996 | DiStefano et al. | 29/830 |
| 5,575,662 A * | 11/1996 | Yamamoto et al. | 439/67 |
| 5,576,519 A * | 11/1996 | Swamy | 174/265 |
| 5,610,371 A * | 3/1997 | Hashimoto et al. | 174/262 |
| 5,617,300 A * | 4/1997 | Anzawa et al. | 361/795 |
| 5,688,584 A * | 11/1997 | Casson et al. | 428/209 |
| 5,825,633 A * | 10/1998 | Bujalski et al. | 361/804 |
| 5,873,740 A * | 2/1999 | Alcoe et al. | 439/67 |
| 5,896,276 A * | 4/1999 | Tamura et al. | 361/767 |
| 5,938,455 A * | 8/1999 | Glovatsky et al. | 439/74 |
| 6,030,234 A * | 2/2000 | Berg et al. | 439/67 |
| 6,086,384 A * | 7/2000 | Fuerst et al. | 439/67 |
| 6,188,028 B1 | 2/2001 | Haba et al. | |
| 6,190,209 B1 * | 2/2001 | Hulsmann et al. | 439/660 |
| 6,200,146 B1 * | 3/2001 | Sarkissian | 439/79 |
| 6,347,042 B1 * | 2/2002 | White | 361/784 |
| 6,456,506 B1 * | 9/2002 | Lin | 361/816 |
| 6,490,168 B1 * | 12/2002 | Killarney et al. | 361/784 |
| 6,493,932 B1 | 12/2002 | Haba | |
| 6,524,115 B1 * | 2/2003 | Gates et al. | 439/66 |
| 6,564,450 B2 * | 5/2003 | Engbring et al. | 29/830 |
| 6,675,473 B2 * | 1/2004 | Ross et al. | 29/852 |
| 6,881,074 B1 * | 4/2005 | McLenaghan | 439/70 |
| 6,890,063 B2 * | 5/2005 | Kim | 347/56 |
| 6,921,860 B2 * | 7/2005 | Peterson et al. | 174/523 |
| 7,087,846 B2 * | 8/2006 | Alcoe | 174/267 |
| 7,416,759 B2 * | 8/2008 | Shintate et al. | 427/97.1 |
| 7,448,923 B2 * | 11/2008 | Uka | 439/876 |
| 7,541,826 B2 * | 6/2009 | Koliopoulos et al. | 324/765 |
| 2001/0051392 A1 * | 12/2001 | Akram | 438/106 |
| 2002/0151196 A1 * | 10/2002 | Tai et al. | 439/67 |
| 2006/0005992 A1 * | 1/2006 | Pav et al. | 174/138 G |
| 2006/0009051 A1 * | 1/2006 | Schuylenbergh et al. | 439/67 |
| 2007/0066092 A1 * | 3/2007 | Soeta | 439/67 |
| 2008/0254653 A1 * | 10/2008 | Uka | 439/67 |

FOREIGN PATENT DOCUMENTS

| | | |
|---|---|---|
| JP | 07-263830 | 10/1995 |
| JP | 2001-076787 | 3/2001 |
| JP | 2002-305361 | 10/2002 |
| JP | 2005-044779 A | 2/2005 |

\* cited by examiner

CONNECTOR STRUCTURE (1)

CONNECTOR STRUCTURE (2)

CONNECTOR STRUCTURE (3)

CONNECTOR STRUCTURE (4)

CONNECTOR STRUCTURE (5)

ELECTRICAL CONNECTION STRUCTURE

RELATED APPLICATIONS

This is a U.S. National Phase Application under 35 USC 371 of International Application PCT/JP2006/321534 filed on Oct. 27, 2006.

TECHNICAL FIELD

This invention relates to an electrical connection structure, more specifically, an electrical connection structure formed by a pair of connecting members which can be reduced in height and achieve space-saving, and which allows the connecting members to be attached and detached from each other, repeatedly.

BACKGROUND ART

Recently, in respect of a variety of electric and electronic apparatuses, reduction in size, thickness and weight and multi-functionalization are progressing rapidly. Particularly in the fields of cellular phones, laptop computers, digital cameras and the like, a demand for reduction in size and thickness as well as multi-functionalization is becoming very strong.

These types of electric and electronic apparatuses are produced incorporating a large number of electric and electronic components of various kinds, including circuit boards, where the electric and electronic components need to be electrically connected to each other.

A variety of methods are carried out for such connection.

For example, as a method for surface-mounting a semiconductor device onto a circuit board, an ACF connection method is known, in which an anisotropic conductive film is disposed between pads of a circuit board and pads of a semiconductor device, and then the whole is subjected to hot-pressing and bonding to electrically connect the circuit board and the semiconductor device. There are also known a method in which a semiconductor device with solder-bumps formed at pads is placed on a circuit board such that the solder-bumps are located on pads of the circuit board, and the whole is subjected to a reflow process; and a flip-chip method which is a variant of this method. There is also a method in which pads of a mounted component are wire-bonded to pads of a circuit board.

Any of these methods requires a special apparatus for connecting work, and once a connecting member is connected, it cannot be detached. Thus, when some circuit component needs to be replaced due to a design change or some connecting member needs to be replaced due to a failure, replacement of such circuit component or connecting member is very difficult. Thus, even when the other components are in order, the whole module has to be scrapped after all. In other words, in these connection methods, repair of each component is very difficult.

In the ACF connection method, the pitch between pads can be narrowed to 40 μm or so, and the height of a connection structure can be reduced to 100 μm or less. Although the ACT connection method thus relatively contributes to reduction in height of the connection structure and space-saving, the connection structure formed has drawbacks such that connection reliability is low, that a large current is not allowed to flow through, and that noise level is high. Thus, the connection structure formed by the ACF connection method is enough for practical use in consumer liquid-crystal modules through which only a small current flows and whose usage environment is not hard, but cannot serve for general uses including industrial uses.

In the connection method using the reflow process, if the pitch between bumps is narrowed to 150 μm or less, a short circuit can form between bumps due to melted solder. Thus, multi-pin formation is restricted. Meanwhile, in the wire-bonding connection method, portions at which wires are bonded are not very high in mechanical strength and vulnerable to external forces. Further, wire-bonding connection structure is inferior to, for example connection structure formed by the flip-chip method or the reflow process in respect of space-saving, since curved wires are bonded to the outside of a mounted component.

In any of these connection methods, connecting members form a permanent connection and do not allow repetition of a connecting operation. Further, if repair or change of a circuit is attempted forcibly, it results in breaking and scrapping the circuit partially or totally.

There is a connector structure in which an electrical connection between components is formed by mechanically engaging male and female connectors. This allows connecting members to be attached and detached from each other, repeatedly. There are actually used, for example an FFC connector structure in which, into female connectors mounted on a circuit board in a row, male connectors formed likewise in a row at an end of a flexible substrate are directly inserted; a pair connector structure in which, into female connectors mounted on a circuit board normally in two rows, male connectors formed likewise in two rows at an end of a flexible substrate are fitted; and a pin grid array connector structure which is a variant of the pair connector structure and in which the connecting terminals of male and female connectors are arranged in a grid-like array.

Use of such connector structure has an advantage that it allows repair. Specifically, since the components are detachably connected, even if some component goes out of order, it can be detached and replaced with a new component.

However, since the male and female connectors forming such connector structure, particularly the female connectors are normally fabricated from metal sheets using dies, the possibility of producing fine male and female connectors with high accuracy is limited. Thus, it is quite difficult to reduce the height of the connection structure in this connector structure.

For example, in the FFC connector structure, the height of the connection structure is normally 1 mm or greater. The minimum pitch between connecting terminals is 0.3 mm or so, and the connecting terminals are arranged in a row at one end. When the number of pins becomes 40 or greater, limitations on circuit design increase and actual inserting and pulling-out operations become difficult.

In the pair connector structure, the height of the connection structure is normally 1.3 mm or greater, and the minimum pitch is 0.5 mm or so. Although the connecting terminals can be arranged in two rows, when the number of pins becomes 60 or greater, limitations on circuit design likewise increase and actual inserting and pulling-out operations become difficult. Also the cost of producing the connectors increases.

The pin grid array connector structure can include an increased number of pins and is suited for space-saving. Meanwhile, it is difficult to reduce the pitch to less than 2 mm, and it is also difficult to reduce the height of the connection structure to less than 4 mm. Further, the cost of the pin grid array type connector structure is high, which hinders the application of this structure to general uses.

DISCLOSURE OF THE INVENTION

The primary object of this invention is to provide an electrical connection structure, in which a connection is formed by detachably connecting a pair of connecting members, and which has a height of 0.5 mm or less.

In order to achieve the above object, the present invention provides an electrical connection structure for forming an electrical connection between a first connecting member and a second connecting member, the first connecting member comprising a flexible substrate comprising a flexible insulating film, at least one conductive pad formed on at least one side of the insulating film, a conductive circuit pattern continuously extending from the rim of the pad, a through-hole formed through the thickness of the insulating film at a planar position within the pad, and a small aperture formed at a planar position within the pad and communicating with the through-hole, the second connecting member comprising a conductive projection formed on at least one side of the second connecting member and electrically connected with a conductive circuit pattern formed inside or on the second connecting member, wherein the electrical connection is formed in a manner such that the conductive projection of the second connecting member is inserted in the through-hole of the first connecting member, through the small aperture in the pad, and mechanically contacts the pad bending the pad and the portion of the insulating film under the pad, along the direction of insertion of the conductive projection, so that the pad is pressed onto the conductive projection due to elastic force of the pad and insulating film bent.

The present invention also provides, as preferred structures, an electrical connection structure wherein the first connecting member has a plurality of the above-mentioned pads, arranged in a grid-like array, and the second connecting member has a plurality of the above-mentioned conductive projections, arranged in a grid-like array corresponding to the array of the pads;

an electrical connection structure wherein the first connecting member further comprises a conductive projection formed on one or each side of the above-mentioned flexible substrate;

an electrical connection structure wherein a bump electrode is formed on the side of the first connecting member opposite to the side with the pad formed on, or on the side of the second connecting member opposite to the side with the conductive projection formed on; and an electrical connection structure wherein the second connecting members comprises a flexible substrate having the same structure of the flexible substrate of the first connecting member, and the above-mentioned conductive projection is formed on each of the flexible substrates constituting the first and second connecting members, on the side opposite to the side with the pad formed on, where the pad and the conductive projection are each located at the periphery of the flexible substrate, leaving an area for mounting a semiconductor device in the center of the flexible substrate.

BEST MODE OF CARRYING OUT THE INVENTION

First, a basic form of an electrical connection structure according to the present invention will be described.

Figure 1:
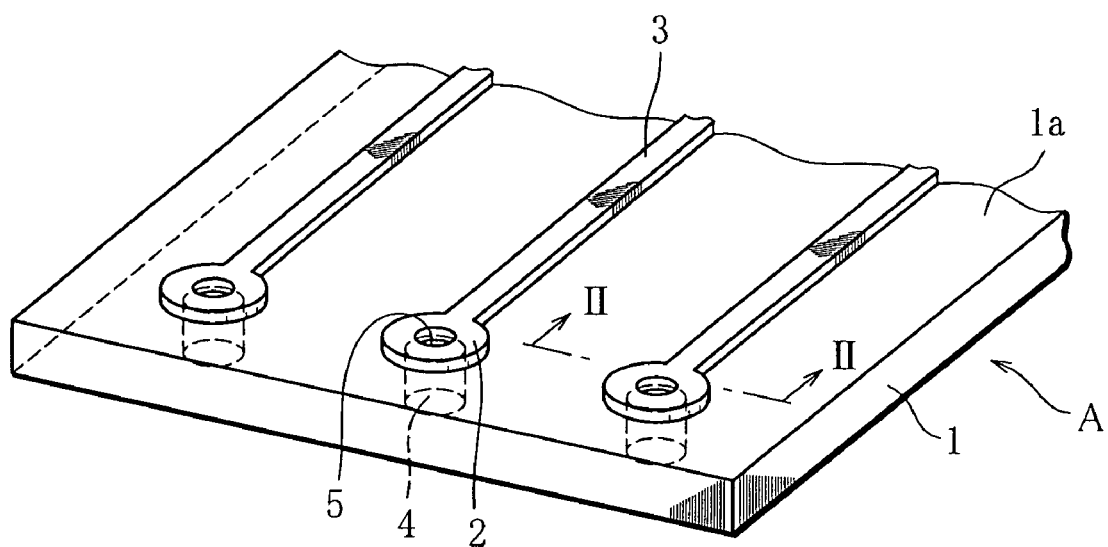
FIG. 1 A partial perspective view showing an example A of a first connecting member for constructing an electrical connection structure according to the present invention.
Figure 2:
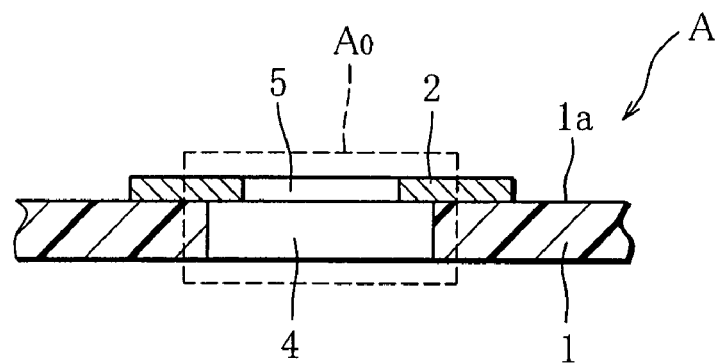
FIG. 2 A cross-sectional view along line II-II of FIG. 1.
Figure 3:
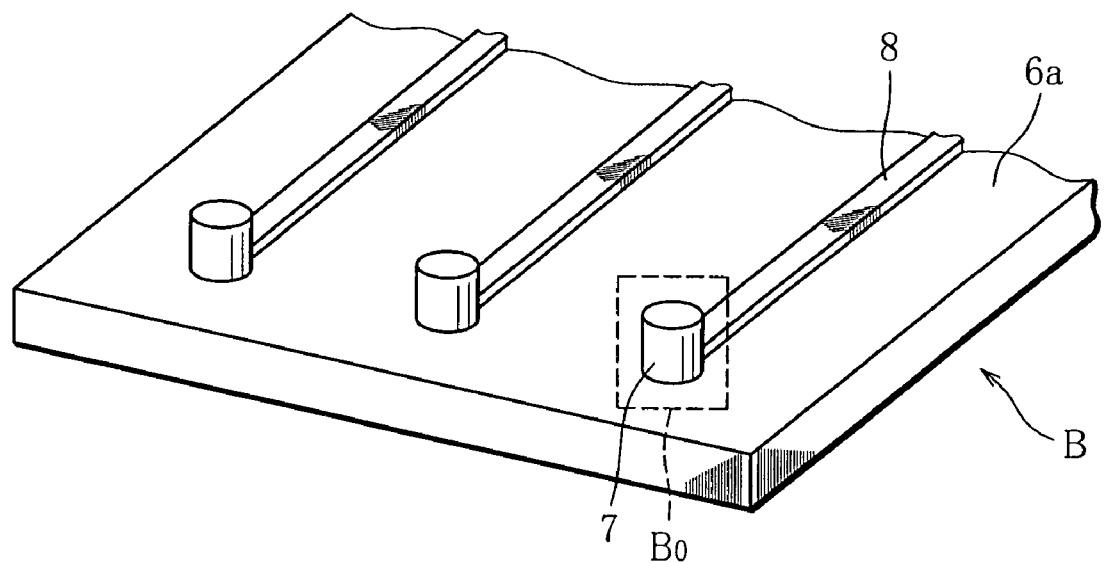
FIG. 3 A partial perspective view showing an example B of a second connecting member for constructing an electrical connection structure according to the present invention.

The electrical connection structure according to the present invention is constructed by a first connecting member A formed of a flexible substrate, of which an example is shown in FIG. 1 and FIG. 2, a cross-sectional view along line II-II of FIG. 1, and a second connecting member B, of which an example is shown in FIG. 3, more specifically by inserting a conductive projection 7 of the second connecting member B into a through-hole 4 of the first connecting member A. The electrical connection structure has, for example a cross-sectional structure shown in FIG. 7.

The first connecting member A is a so-called flexible substrate, and comprises a flexible and thin insulating film 1, at least one (three in FIG. 1) pad 2 formed at a determined location on one side 1a of the film, a conductive circuit pattern 3 intended as a signal line, formed on the side 1a of the insulating film 1 according to a determined pattern to continuously extend from the rim of each pad 2, a through-hole 4 formed through the thickness of the insulating film 1, at a planar position within each pad 2, and a small aperture 5 formed at a planar position within the pad 2, communicating with the through-hole 4 and smaller in planar size than the through-hole 4. In the example shown in FIGS. 1 and 2, the pad 2 partly overhangs the through-hole 4.

For the insulating film 1, which is a base member for the first connecting member A, a film of resin such as polyimide, polyester, liquid-crystal polymer, or polyether ether keton (PEEK), a thin glass epoxy composite board, a BT resin substrate or the like can be used.

In light of the purpose of reducing the height of an electrical connection structure, it is desirable that the insulating film be as thin as possible, although it needs to ensure a sufficient mechanical strength. Regarding commercially available insulating films and the like of the types mentioned above, the minimum thickness is 12.5 μm. Also an insulating film obtained by appropriately casting or extrusion-molding the above-mentioned resin to a thickness of 10 μm or less can be used for the insulating film 1.

It is desirable that the pad 2 be made from a material having both conductivity and elasticity. As described later, in this electrical connection structure A, a conductive connection between the two connecting members is formed in a manner such that when the conductive projection 7 of the second connecting member B is inserted into the through-hole 4 just below the pad 2, the pad 2 bent along the direction of insertion of the conductive projection 7 is pressed onto the conductive projection 7 due to its resilience. Thus, the pad 2 requires conductivity as an indispensable quality and also requires elasticity. Specifically, metals such as copper, nickel, stainless steel, phosphor bronze and Inconel (trademark), and a conductive resin composition with conductive powder dispersed in resin are good examples of the material of this type.

Although the pad does not need to have a particular thickness, the pad is, desirably, not very thick, in order to produce a sufficient elasticity. The upper limit for thickness of the pad should be 100 μm or so. The pad formed of a copper coating formed by plating, a nickel film formed by spattering, or a conductive layer consisting of a combination of such copper coating and nickel film is desirable, since in that case, even with a thickness of 0.05 μm or so, the pad has a sufficient conductivity and elasticity.

The first connecting member A shown in FIG. 1 can be produced as follows: For example, a film with a copper coating on one side is prepared. By applying photolithography and etching techniques to the surface of the copper coating, the copper coating is removed, leaving the portions intended to form the pads 2 and conductive circuit patterns 3. Then, for example, by applying laser light from the side opposite to the pads 2, through-holes 4 are formed just below the individual pads 2. Last, after a mask is applied exposing that portion of each pad 2 at which the small aperture should be formed, copper is removed by etching, to form a small aperture 5 communicating with the through-hole 4. By combining processing techniques such as chemical etching and plasma etching, the mass-production costs can be reduced a great deal.

The second connecting member B is, as described later, an electric-electronic component, a printed circuit board or the like, and has at least one (three in FIG. 3) conductive projection 7 formed on one side 6a and an conductive circuit pattern 8 intended as a signal line, formed on the side 6a according to a determined pattern to continuously extend from each conductive projection 7.

The pattern of array of the conductive projections 7 is the same as that of the through-holes 4 of the first connecting member A shown in FIG. 1. The conductive projection 7 is smaller than the through-hole 4 of the first connecting member A and greater than the small aperture 5, in cross-sectional size. The conductive circuit patterns 8 may be provided inside the second connecting member B in a buried state, instead of being provided on the surface 6a of the second connecting member B.

The second connecting member B is a counterpart of the first connecting member A, and for example a printed circuit board of a common rigid type, a semiconductor module or device which can vary in type, or a sensor device, display device or the like which can vary in type. The second connecting member B can be a flexible substrate like the first connecting member A.

The second connecting member B is produced by forming the above-mentioned conductive projections onto a determined surface of such printed circuit board or electric-electronic component.

The conductive projections can be formed, for example by applying common plating or electroforming selectively to lands or terminals exposed on the surface of the second connecting member B, thereby depositing a conductive material on those parts to form projections of a determined shape. Alternatively, the conductive projections can be formed by applying partial etching to a thick layer of a conductive material deposited on the surface of the second connecting member B.

Alternatively, stud bumps formed using a wire bonding technique can be used for the conductive projections. Further, the conductive projections can be formed at necessary places by performing screen-printing onto the surface of the second connecting member using a conductive paste.

Figure 4:
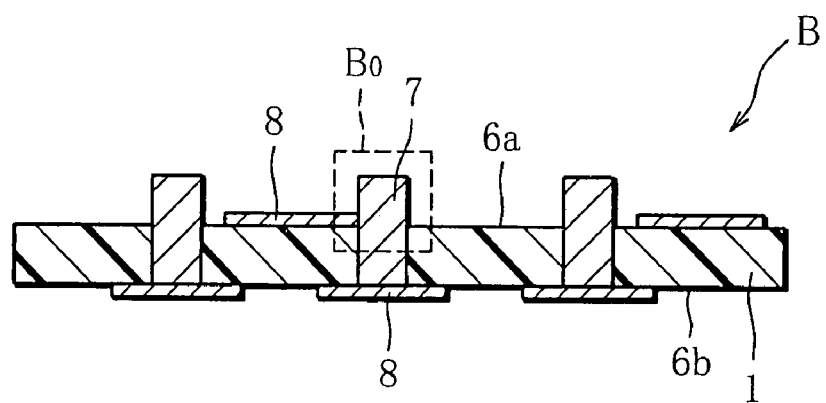
FIG. 4 A cross-sectional view showing another example of the second connecting member B.

The conductive projections can be formed not only on the conductive circuit patterns 8 formed on the surface 6a of the second connecting member B, but also in vias or the like. For example, as shown in FIG. 4, when the second connecting member B is a flexible substrate comprising a thin insulating film as a base member, a conductive projection 7 can be formed to project from a conductive circuit pattern 8 formed on the other side 6b, through the thin insulating film 1, to the side 6a. This structure has an advantage that the conductive projection 7 formed to the second connecting member B has an increased mechanical strength.

Figure 5:
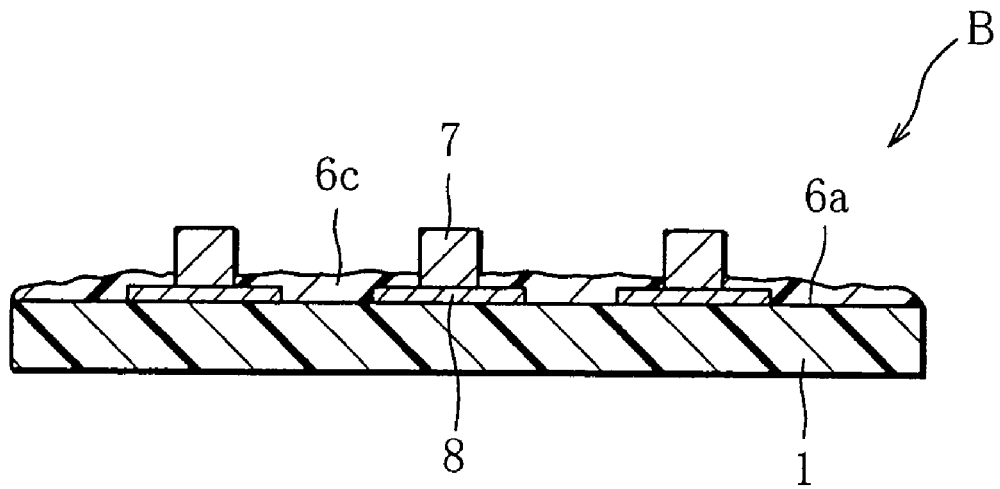
FIG. 5 A cross-sectional view showing another example of the second connecting member B.

As shown in FIG. 5, also in a structure such that a conductive projection 7 is formed at a determined position on a conductive circuit pattern 8 on a flexible substrate comprising an insulating film 1 as a base member, and a coverlay 6c is further provided, the conductive projection 7 can have an increased mechanical strength.

Figure 6:
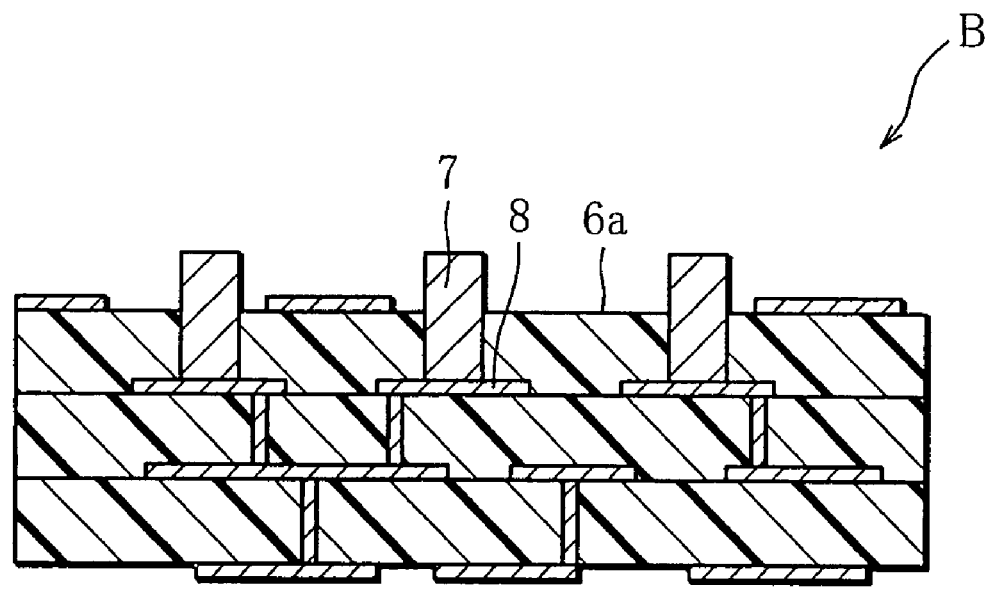
FIG. 6 A cross-sectional view showing another example of the second connecting member B.

Further, as shown in FIG. 6, also in the case of a second connecting member B with a conductive projection 7 formed to project from an inner-layer circuit of a multi-layer rigid printed circuit board to the surface 6a of the uppermost layer, the similar effect can be obtained.

In order to construct electrical connection structures according to the present invention, the conductive projections 7 of the second connecting member B are inserted into the through-holes 4 just below the pads 2 of the first connecting member A, respectively.

Figure 7:
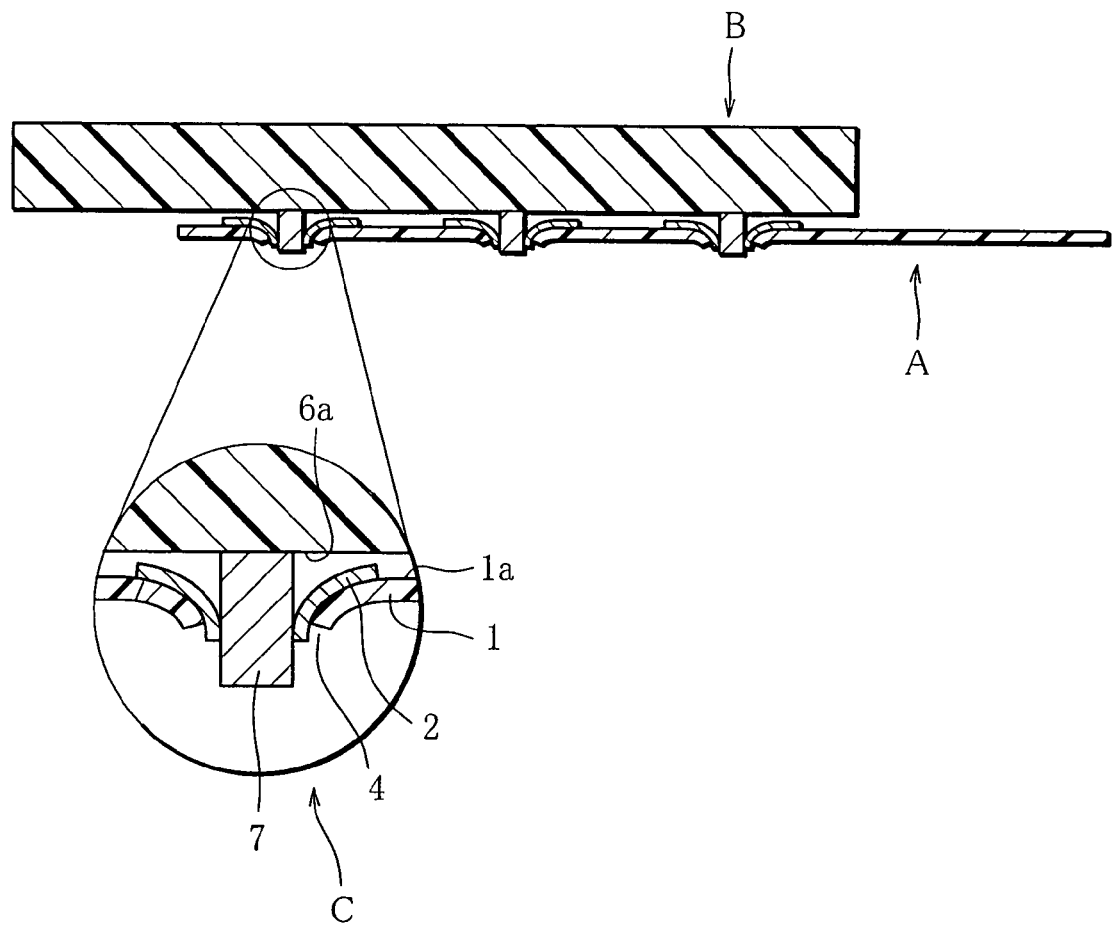
FIG. 7 A cross-sectional view showing an example of an electrical connection structure according to the present invention.

Consequently, as shown in FIG. 7, each conductive projection 7 penetrates into the through-hole 4, through the small aperture 5 in the pad 2. In this process, the portion of the pad which overhangs the through-hole 4 is expanded and bent, the insulating film is also bent simultaneously with the pad 2, and due to their resiliency, the overhanging portion of the pad 2 is pressed onto a middle portion of the conductive projection 7. Consequently, an electrical connection structure C electrically connecting the conductive projection 7 and the pad 2, and therefore electrically connecting the first connecting member A and the second connecting member B is constructed. A signal transmitted through a conductive circuit pattern on one of the connecting members is transmitted to the other connecting member, through this electrical connection structure C.

Thus, in the electrical connection structure C, the portion of the first connecting member A comprising a small aperture 5, a pad 2 and a through-hole 4 functions as a female terminal $A_0$, as indicated in FIG. 2, while the conductive projection 7 of the second connecting member B functions as a male terminal $B_0$.

Since the connection structure C is formed by mechanical contact between the pad 2 constituting the female terminal $A_0$ of the first connecting member A and the conductive projection 7 of the second connecting member B, the connection structure C can be disassembled by pulling the first connecting member A away from the second connecting member B. At this time, the pad 2 returns from the bent state to the original position, due to the elasticity of the material, so that the female terminal $A_0$ comes into a reusable state.

Figure 8:
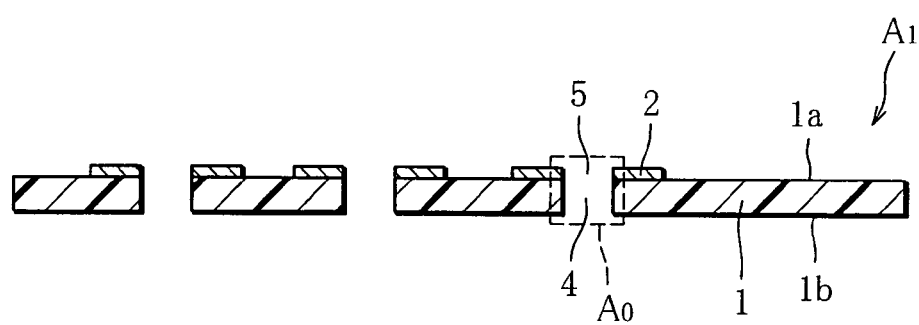
FIG. 8 A cross-sectional view showing an example $A_1$ of the first connecting member.

In the electrical connection structure according to the present invention, in order to increase the reliability and certainty of the connection, it is desirable that the female terminal $A_0$ of the first connecting member A and the male terminal $B_0$ of the second connecting member B be formed as follows:

First, in the case of a female terminal $A_0$ of a first connecting member $A_1$ shown in FIG. 8, a pad 2 is formed on one side 1a of an insulating film 1, and a small aperture 5 in the pad 2 and a through-hole 4 have the same planar shape.

Figure 9:
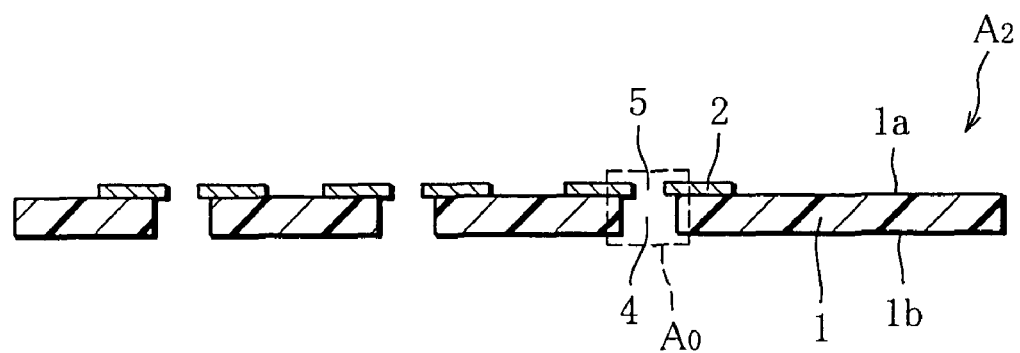
FIG. 9 A cross-sectional view showing an example $A_2$ of the first connecting member.

In the case of a female terminal $A_0$ of a first connecting member $A_2$ shown in FIG. 9, a small aperture 5 in a pad 2 formed on one side 1a of an insulating film 1 is smaller than a through-hole 4, so that the pad 2 partly overhangs the through-hole 4.

Figure 10:
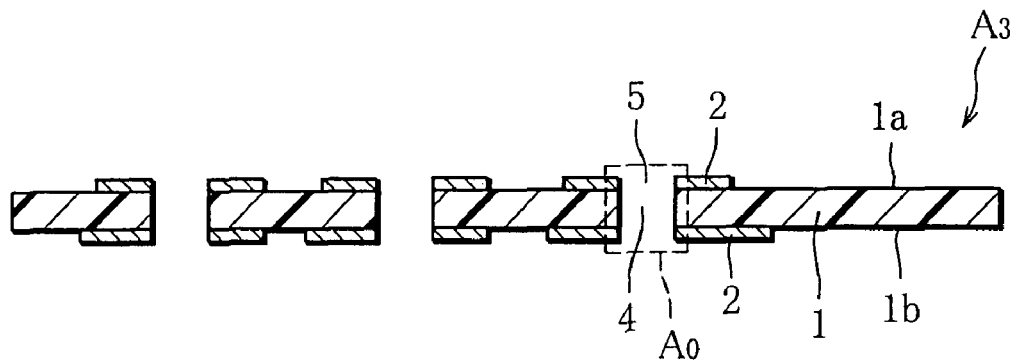
FIG. 10 A cross-sectional view showing an example $A_3$ of the first connecting member.

In the case of a female terminal $A_0$ of a first connecting member $A_3$ shown in FIG. 10, a pad 2 is formed also on the other side 1b of an insulating film 1, and a small aperture 5 and a through-hole 4 have the same size.

Figure 11:
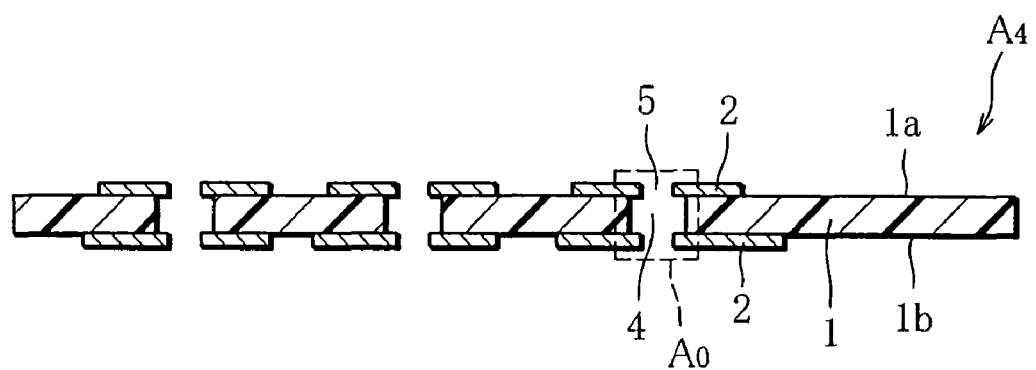
FIG. 11 A cross-sectional view showing an example $A_4$ of the first connecting member.

In the case of a female terminal $A_0$ of a first connecting member $A_4$ shown in FIG. 11, a pad 2 is formed also on the other side 1b of an insulating film 1, and the pads 2, 2 on the upper and lower sides each partly cover a through-hole 4.

Figure 12:
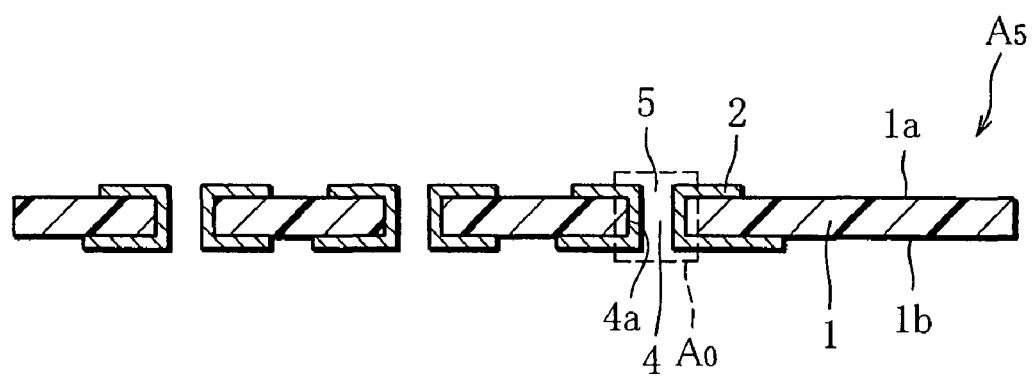
FIG. 12 A cross-sectional view showing an example $A_5$ of the first connecting member.

In the case of a female terminal $A_0$ of a first connecting member $A_5$ shown in FIG. 12, pads 2, 2 are formed on the upper side 1a and lower side 1b of an insulating film 1, and the pads 2, 2 are electrically connected, for example by a precious metal coating on the wall surface 4a of a through-hole 4, formed by elecroless plating. The small aperture 5 and the through-hole 4 have the same size.

Among the first connecting members of the above-mentioned types, the type having a pad 2 on each side of an insulating film 1, such as the connecting members $A_3$, $A_4$, has an advantage that the female terminal $A_0$ has an increased elasticity. In respect of the conductivity of the connection formed, the type having a through-hole with a wall surface plated with a corrosion-resistant precious metal, such as the connecting member $A_5$, is superior.

Figure 13:
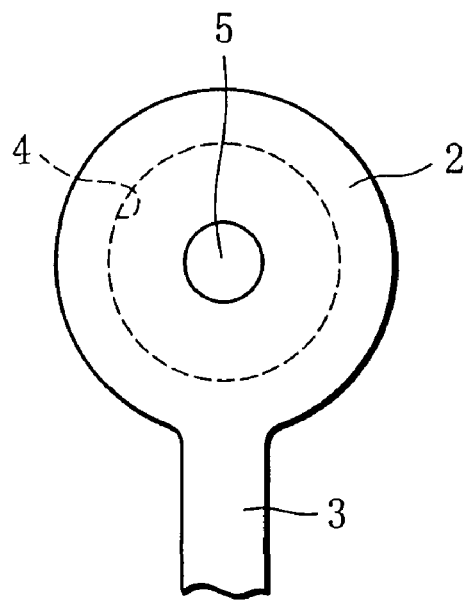
FIG. 13 A plan view showing an example of a pad.
Figure 16:
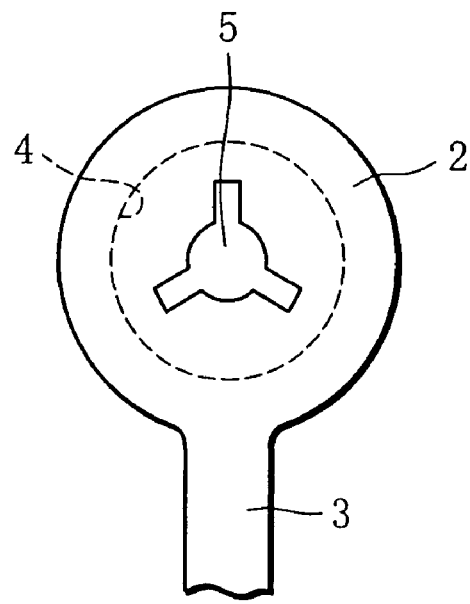
FIG. 16 A plan view showing an example of the pad.
Figure 17:
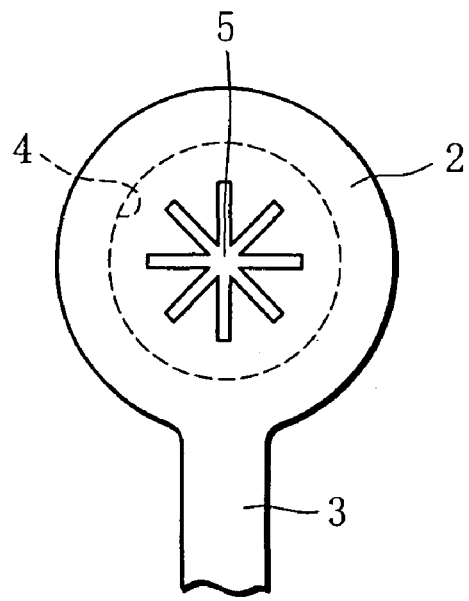
FIG. 17 A plan view showing another example of the pad.
Figure 18:
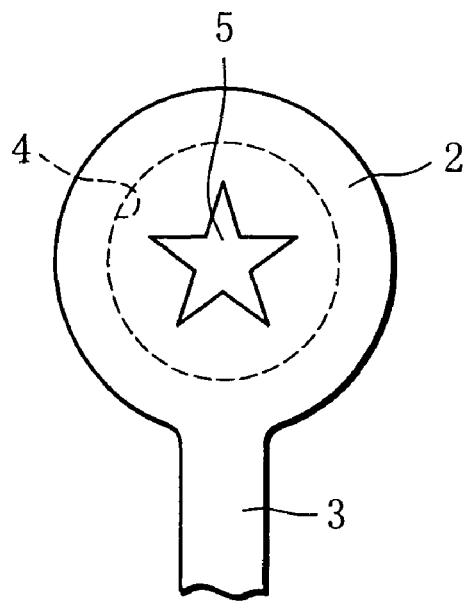
FIG. 18 A plan view showing another example of the pad.
Figure 19:
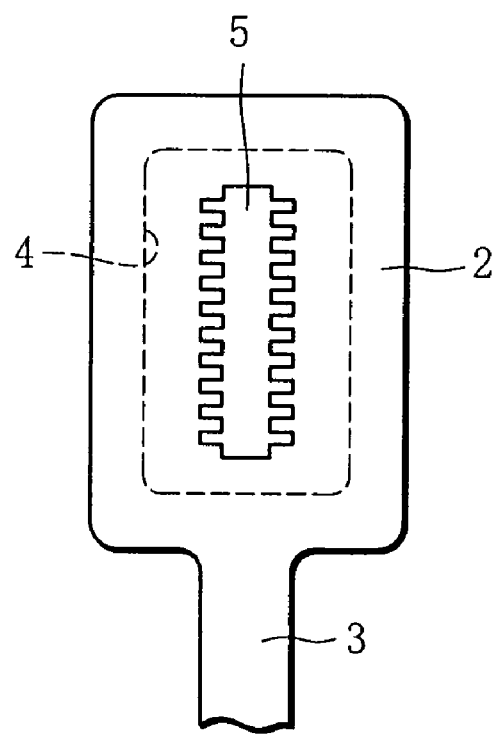
FIG. 19 A plan view showing another example of the pad.

The planar shape of the small aperture 5 formed in the pad 2 is not restricted to a particular one, but can be any shape that allows the insertion of the conductive projection 7 constituting the male terminal $B_0$ described later. For example, the small aperture 5 can be a round opening smaller in diameter than the through-hole 4 as shown in FIG. 13, a cross-shaped slit as shown in FIG. 14, an aperture formed of a combination of a round opening and a cross-shaped slit as shown in FIG. 15, an aperture formed of a combination of a round opening and a three-way slit as shown in FIG. 16, an aperture formed of a plurality of slits radiating from a center as shown in FIG. 17, a star-shaped aperture as shown in FIG. 18, an aperture of a centipede-like planar shape as shown in FIG. 19, or the like.

Figure 14:
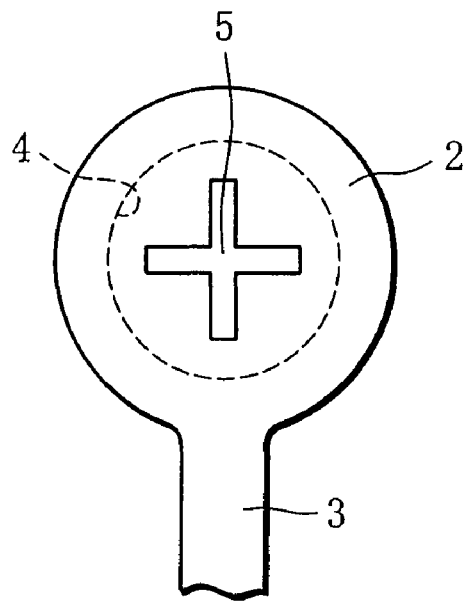
FIG. 14 A plan view showing another example of the pad.
Figure 15:
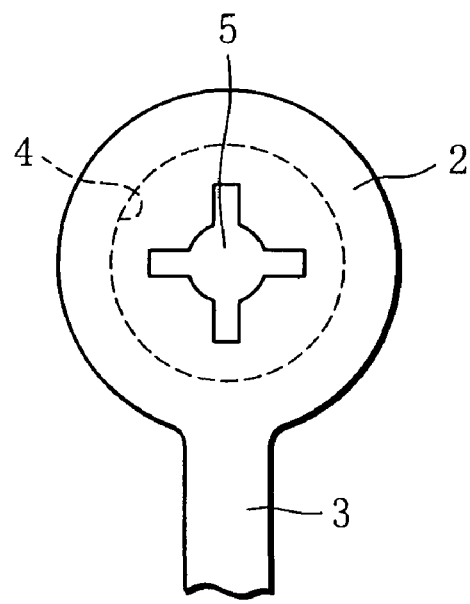
FIG. 15 A plan view showing another example of the pad.

Among the small apertures of the above-mentioned types, for examples the slit-type apertures shown in FIGS. 14 and 15 have an advantage that when the conductive projection 7 of the second connecting member B is inserted, four tongue-like pieces around the slit-type aperture are bent, so that the pad is pressed onto the conductive projection, with certainty. This produces a connection with an increased reliability of conductivity, and ensures a good connection. By increasing the number of slits or arranging that the aperture contacts the conductive projection over a greater length as in FIG. 19, the reliability of the connection can be further increased.

The shape of the conductive projection 7 constituting the male terminal $B_0$ of the second connecting member B is not restricted to a particular one, but can be any shape that ensures conductive contact with the pad 2 when the conductive projection is inserted in the female terminal $A_0$ of the first connecting member A.

Figure 20:
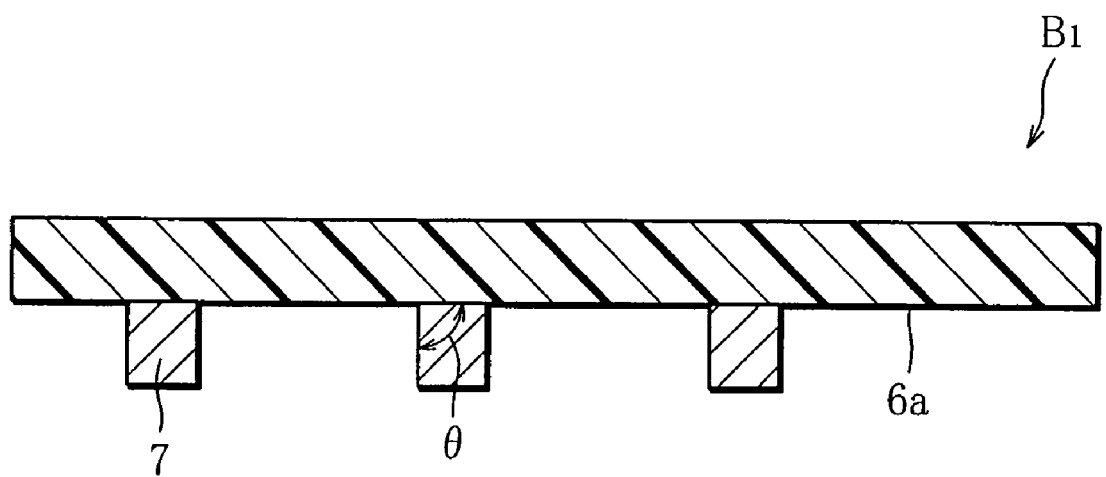
FIG. 20 A cross-sectional view showing an example $B_1$ of the second connecting member.
Figure 21:
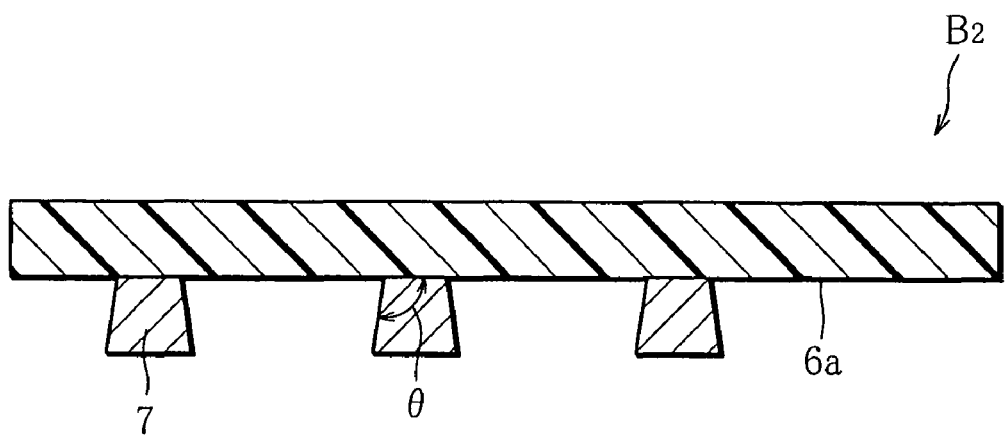
FIG. 21 A cross-sectional view showing an example $B_2$ of the second connecting member.
Figure 22:
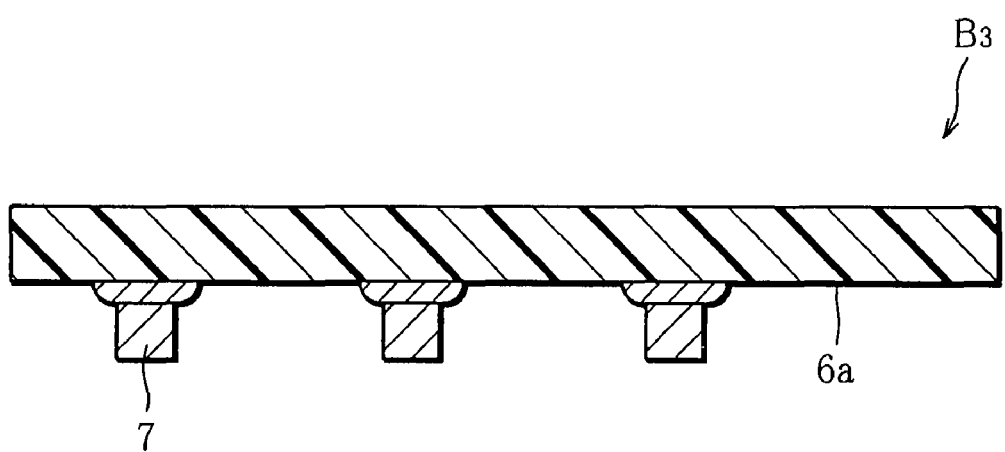
FIG. 22 A cross-sectional view showing an example $B_3$ of the second connecting member.
Figure 23:
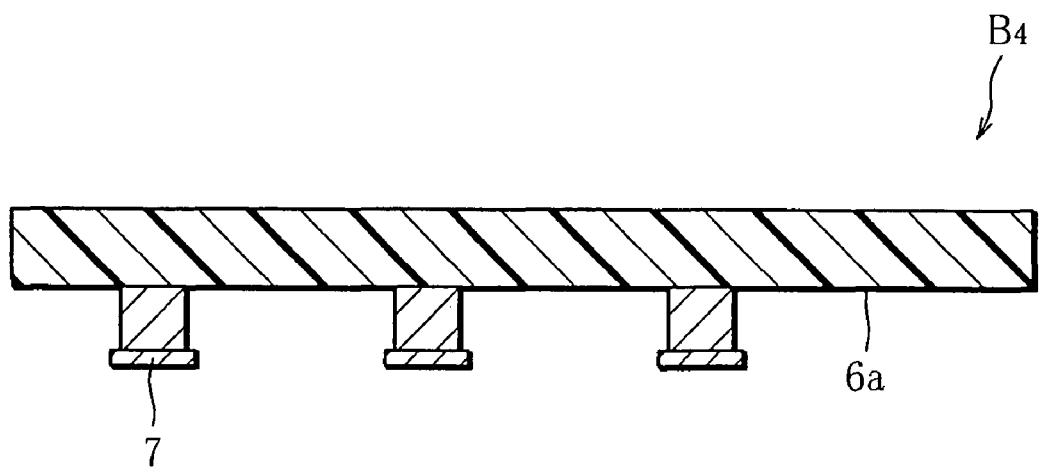
FIG. 23 A cross-sectional view showing an example $B_4$ of the second connecting member.
Figure 24:
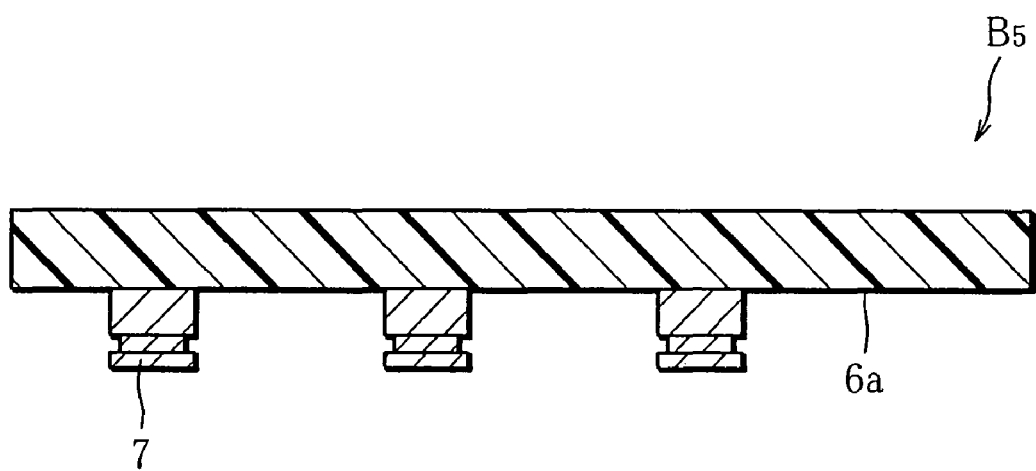
FIG. 24 A cross-sectional view showing an example $B_5$ of the second connecting member.

For example, the conductive projection can be a columnar projection with a rising angle ($\theta$) of 90° relative to the surface 6a as shown in FIG. 20, a projection with an obtuse rising angle ($\theta$) as shown in FIG. 21, a projection like a column with a pedestal greater in diameter than the column as shown in FIG. 22, a columnar projection greater at the top than at the base as shown in FIG. 23, a columnar projection narrowed in the middle as shown in FIG. 24, or the like.

Among the conductive projections of the above-mentioned types, the conductive projection which is greater in cross section at the top than at the base, such as those of the connecting members $B_2$, $B_4$, $B_5$, has an advantage that when inserted in the female terminal $A_0$ of the first connecting member A, the conductive projection anchors itself to the pad 2 of the female terminal $A_0$ so that the conductive projection does not easily come off. In forming the projection like that of the connecting member $B_2$, it is desirable to set the rising angle ($\theta$) to be within the range of 65° to 160°.

It is desirable that the overall height of the conductive projections 7 of the above-mentioned types measured from the surface 6a be 70 µm or greater. If the height is less than 70 µm, the conductive projection inserted in the female terminal $A_0$ of the first connecting member A can fail to mechanically contact the pad 2 or fail to be satisfactorily pressed onto the pad 2, which lowers the connection reliability of the connection structure C. Meanwhile, if the height is too great, it does not meet the purpose of reducing the height of the connection structure C. Thus, the height should be restricted to a maximum of 700 µm or so.

The cross-sectional shape of the conductive projections 7 of the above-mentioned types is not restricted to a particular one, but can be, for example rhombic, rectangular, triangular, polygonal, circular or the like.

When inserted into the female terminal $A_0$, the conductive projection 7 slides over the pad 2. Thus, in order to ensure abrasion resistance, it is desirable that the conductive projection 7, or at least the surface thereof be made of a relatively hard metal or alloy. Specifically, copper, nickel, gold, palladium, rhodium, silver or the like can be used. Further, the conductive projection can be formed by plating a soft core of, for example resin, with, for example nickel, gold, platinum, rhodium, palladium, silver, tin, solder or the like, and then hardening only the surface. Application of a conductive coating material containing carbon, iron or the like is also effective for increasing reliability.

In the connecting member, the planar arrangement of female terminals $A_0$ or of male terminals $B_0$ (conductive projections 7) is not restricted to a particular one. For example, when the first connecting member A has female terminals $A_0$ arranged in a two-dimensional grid-like array and the second connecting member B has male terminals $B_0$ arranged in a two-dimensional grid-like array corresponding to the array of the female terminals $A_0$, they can form a connection portion including many connection points C in a small planar space. This is advantageous in respect of saving the space for the connection portion.

For example, if female terminals $A_0$ of diameter 60 µm are arranged in a two-dimensional array consisting of 100 rows and 100 columns with a pitch 200 µm, a connection portion including 10000 connection points C in a planer space of 20 mm×20 mm can be formed.

By modifying the above-described first connecting member A and second connecting member B and constructing an electrical connection structure C according to the present invention, electric-electronic apparatuses various in function can be produced. This will be explained below in detail.

(1) Connector Structure

Figure 25:
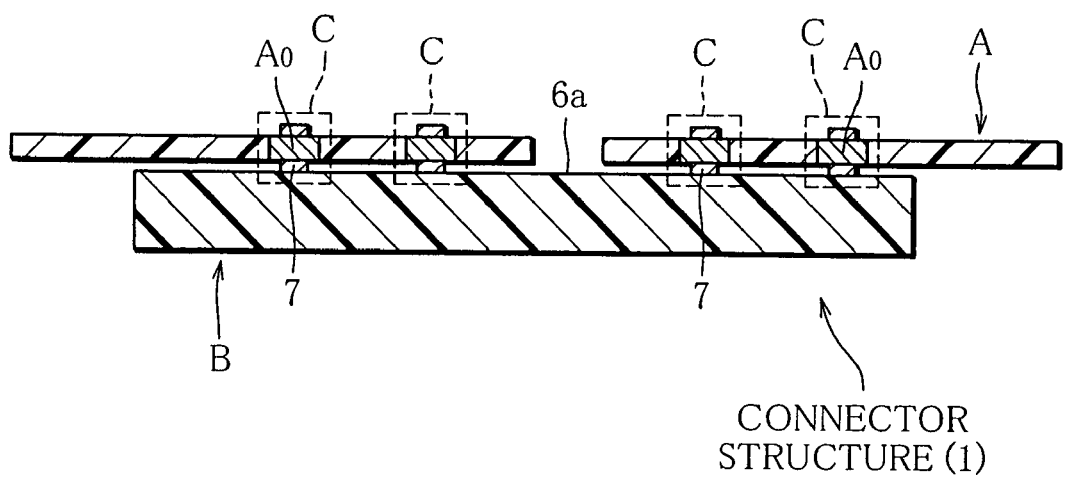
FIG. 25 A cross-sectional view showing a connector structure (1) including an electrical connection structure C according to the present invention.

FIG. 25 shows an example of a connector structure (1) including electrical connection structures C according to the present invention as shown in FIG. 7.

In the connector structure (1) of FIG. 25, electrical connections structures C are formed by inserting conductive projections (male terminals $B_0$) 7 formed on one side 6a of a second connecting member B in a determined array, into female terminals $A_0$ of a first connecting member A, each formed of a through-hole, a pad and a small aperture.

For example, conductive projections (male terminals $B_0$) 7 of diameter 0.15 mm and height 0.15 mm are arranged in a grid-like array consisting of 6 rows and 10 columns, with a pitch 0.5 mm. Meanwhile, to a first connecting member A, through-holes of diameter 0.125 mm, pads of diameter 0.25 mm, and small apertures of diameter 0.1 mm, which are to be located in the center of each pad, are formed to provide female terminals $A_0$ arranged in the same grid-like array as the conductive projections. A 60-pin connector structure including 60 connection structures C formed by these male terminals $B_0$ and female terminals $A_0$ measures 6.0 mm in length, 4.0 mm in width and 0.3 mm in height, and therefore occupies an area 24 mm$^2$ and a volume 7.2 mm$^3$.

Although this connector structure (1) is a narrow-pitch multi-pin structure, it was confirmed in actual connecting work that the female terminals $A_0$ and the male terminals $B_0$ can be aligned easily, and that the male terminals $B_0$ can be smoothly inserted into the female terminals $A_0$. Attaching and detaching operations were able to be carried out smoothly, without any hindrance. Repeating an inserting and pulling-out operation was also easy.

Meanwhile, the minimum size of a conventional 60-pin connector structure in which male and female connectors are mechanically engaged is 3.5 mm or so in length, 21 mm or so in width and 1 mm or so in height, and therefore occupies an area 73.5 mm$^2$ and a volume 73.5 mm$^3$.

As clear from the above, the connector structure (1) having the electrical connection structures C according to the present invention allows smooth inserting and pulling-out operations, achieves a great reduction in height compared with the minimum size of the conventional connector structure, and also achieves space-saving.

The connector structure (1) was subjected to a test for evaluating the reliability of the connection structure C.

Figure 26:
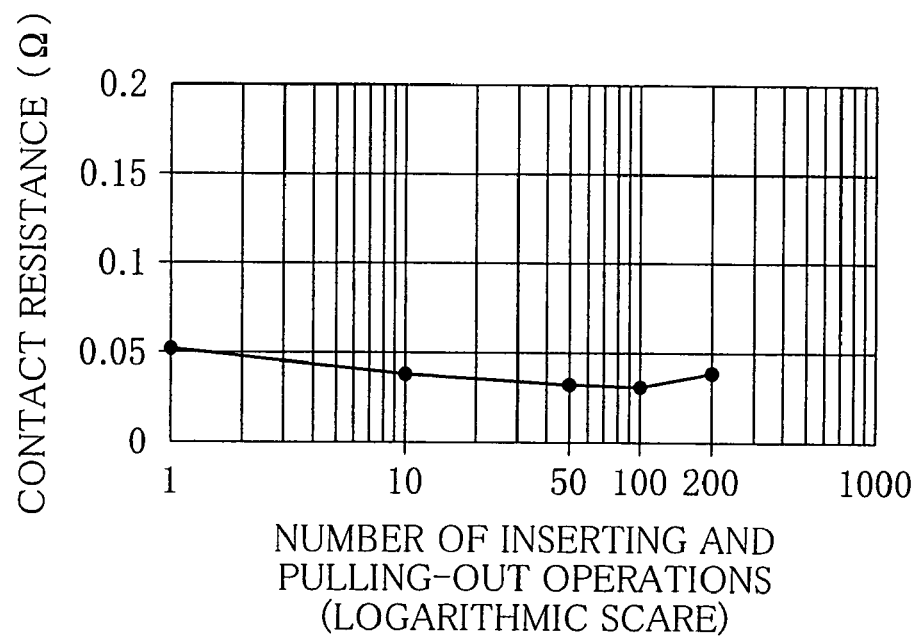
FIG. 26 A graph showing a relation between contact resistance of the connection structure and the number of times that an inserting and pulling-out operation is performed.

(a) Influence Of The Number of Times that an Inserting and Pulling-Out Operation is Performed, upon Contact Resistance Of the Connection Structure To the connector structure (1), an inserting and pulling-out operation was repeated, where, each time, at 13 connection points, the contact resistance of the connection structure was measured. FIG. 26 shows the result, where the contact resistance shown is an average for the 13 connection points.

As clear from FIG. 26, the contact resistance is very small, specifically 0.05Ω or below. Even after the inserting and pulling-out operation was repeated 200 times, the contact resistance showed little increase, and good conductivity was maintained.

Figure 27:
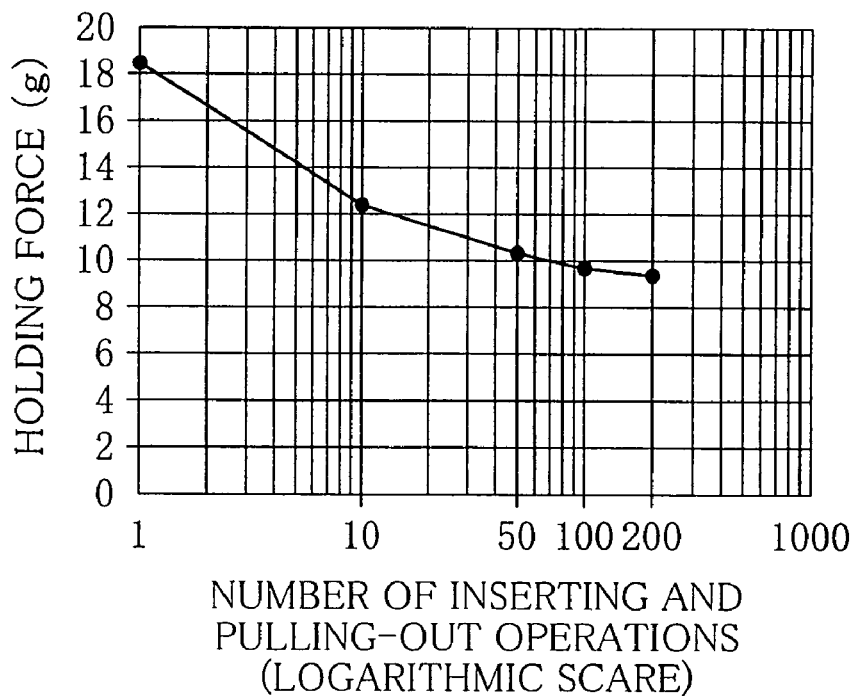
FIG. 27 A graph showing a relation between connection-structure holding force and the number of times that the inserting and pulling-out operation is performed.

(b) Influence of the Number of Times that the Inserting and Pulling-Out Operation is Performed, upon Connection Holding Force To the connector structure (1), the inserting and pulling-out operation was repeated, where, each time, force required for disassembling a connection (connection holding force) was measured. FIG. 27 shows the result.

As clear from FIG. 27, the connection holding force first decreased to some degree while the inserting and pulling-out operation was repeated several ten times, then became stable, then came to change little even though the inserting and pulling-out operation was repeated. Thus, it can be said that the connection structure has high reliability.

It is thought that the decrease in connection holding force observed at the initial stage is a stabilization process in which the female and male terminals become fitted to each other.

(c) Test for Evaluating the Heat Resistance of the Connection Structure

The connector structure (1) was kept in an environment of temperature 120° C., then taken out to measure the contact resistance of the connection structure. The result is shown in FIG. 28, in the form of a relation between contact resistance and keeping time.

Figure 28:
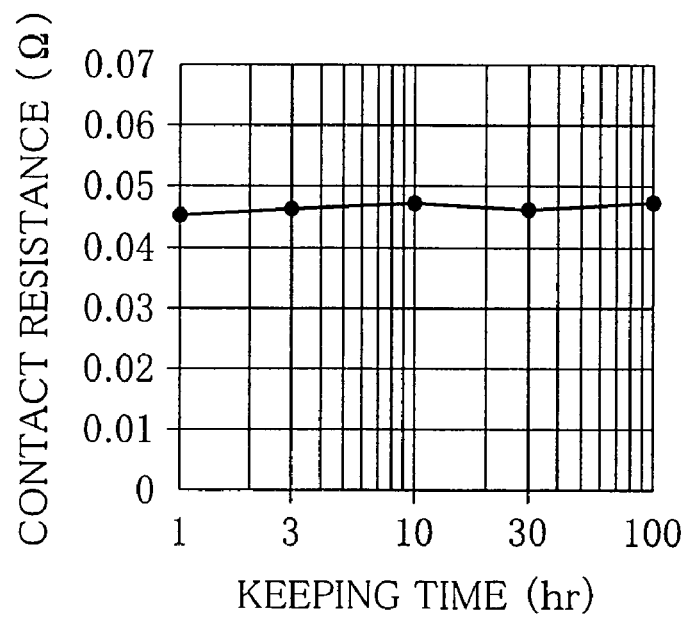
FIG. 28 A graph showing a temporal change of contact resistance of the connection structure kept in an environment of temperature 120° C.

As clear from FIG. 28, even after the connector structure was kept in the environment of temperature 120° C. for 100 hours, the contact resistance of the connection structure showed little change. Thus, the connector structure (1) proved thermally stable.

As clear from the above test results, the connection structure C according to the present invention is small in contact resistance, shows little increase in contact resistance even with the repetition of the inserting and pulling-out operation, is thermally stable, and has high reliability.

Figure 29:
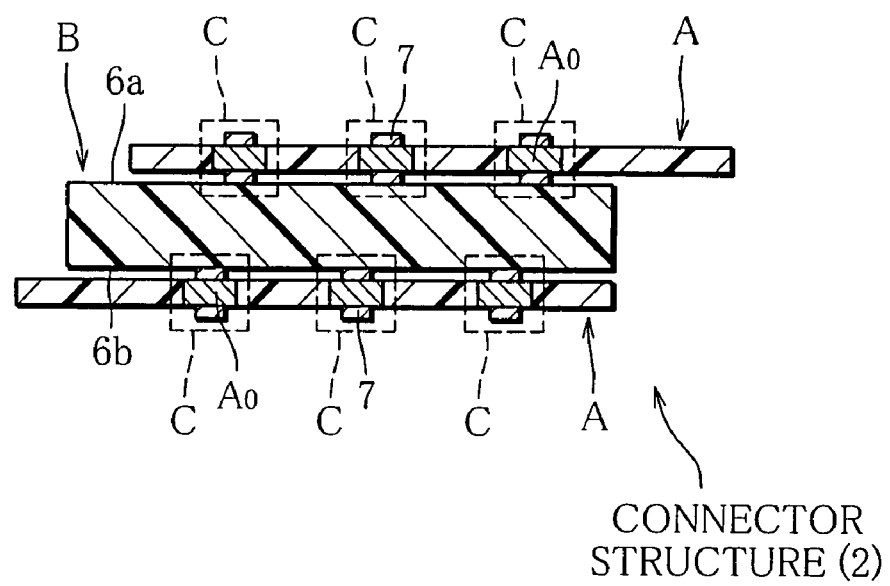
FIG. 29 A cross-sectional view showing a connector structure (2) including an electrical connection structure C according to the present invention.

FIG. 29 shows another connector structure (2).

In the connector structure (2), a second connecting member B with conductive projections 7 formed on the other side 6$b$, in addition to the projections 7 formed on the side 6$a$, is used, and electrical connection structures C according to the present invention are formed by inserting the conductive projections 7 on each side into the female terminals $A_0$ of each of two first connecting members A.

In this connector structure (2), the second connecting member B functions as a male-type interposer.

Figure 30:
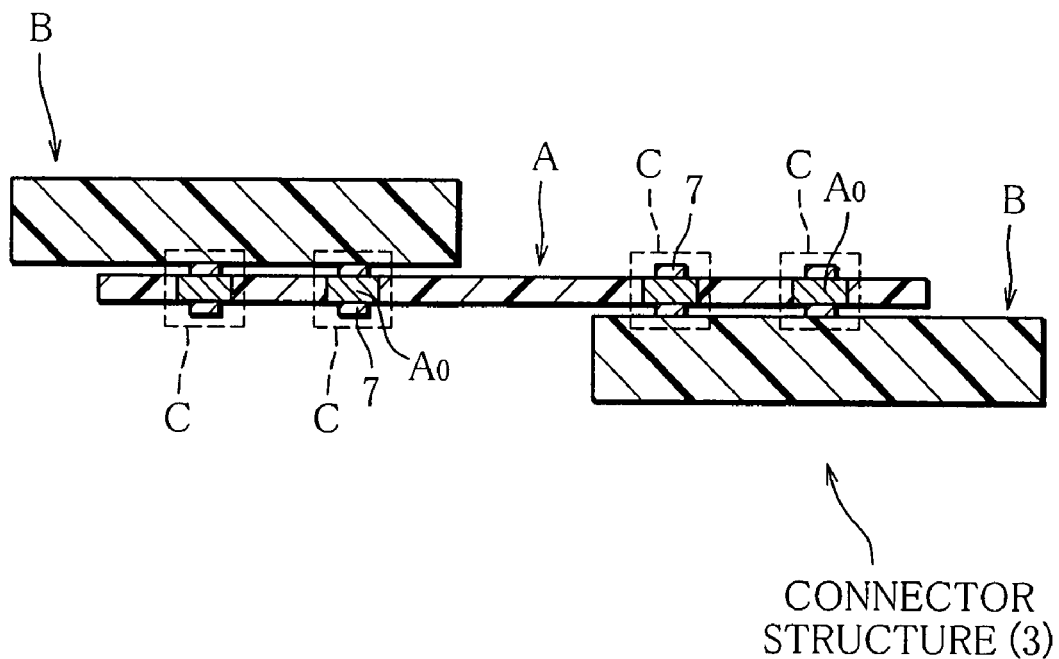
FIG. 30 A cross-sectional view showing a connector structure (3) including an electrical connection structure C according to the present invention.

FIG. 30 shows another connector structure (3).

In the connector structure (3), electrical connection structures C according to the present invention are formed by inserting the conductive projections 7 of two second connecting members B into the female terminals $A_0$ of one first connecting member A, from above and from below the first connecting member A.

Figure 31:
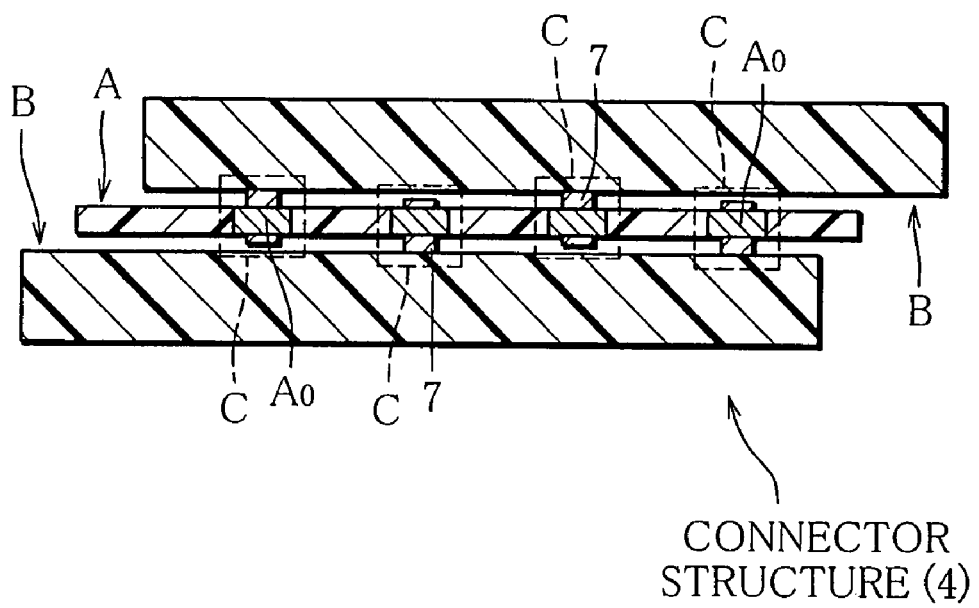
FIG. 31 A cross-sectional view showing a connector structure (4) including an electrical connection structure C according to the present invention.

FIG. 31 shows another connector structure (4).

The connector structure (4) is a variant of the connector structure (3). Here, the first connecting member A functions as a female-type interposer.

Figure 32:
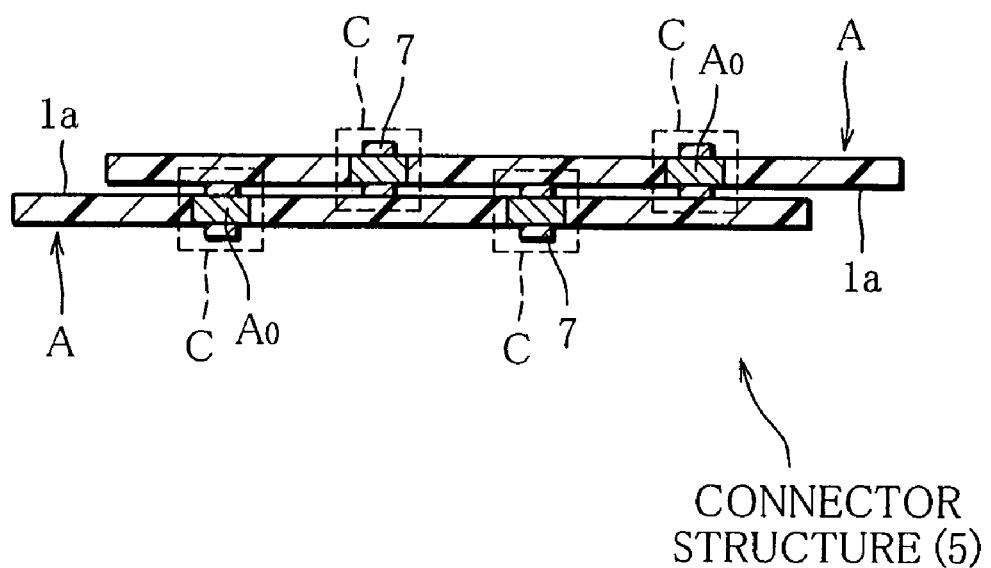
FIG. 32 A cross-sectional view showing a connector structure (5) including an electrical connection structure C according to the present invention.

FIG. 32 shows another connector structure (5).

The connector structure (5) is constructed using two flexible substrates which are variants of the first connecting member A. Specifically, two first connecting members A are each provided with conductive projections on the side 1$a$ with pads formed on, and electrical connection structures C according to the present invention are formed by inserting the conductive projections 7 of each of the two first connecting members A into the female terminals $A_0$ of the other.

In this case, it is desirable to arrange the conductive projections 7 and the female terminals $A_0$ of each first connecting member in a zigzag array such that the conductive projections 7 and the female terminals $A_0$ alternate lengthwise as well as widthwise, since the connection structures C constructed have an increased connection reliability.

In the above-described connector structures, it is desirable for space-saving to arrange the through-holes (and pads) constituting female terminals of the first connecting member A, in a grid-like array, and arrange the conductive projections of the second connecting member B intended as a counterpart, in the corresponding grid-like array, since it can reduce the planar space occupied by the electrical connections C formed, to a great degree.

The above-described connector structures can be disassembled, for example by manually pulling off the first connecting member A formed of a flexible substrate.

(2) Film-Cable Structure

Figure 33:
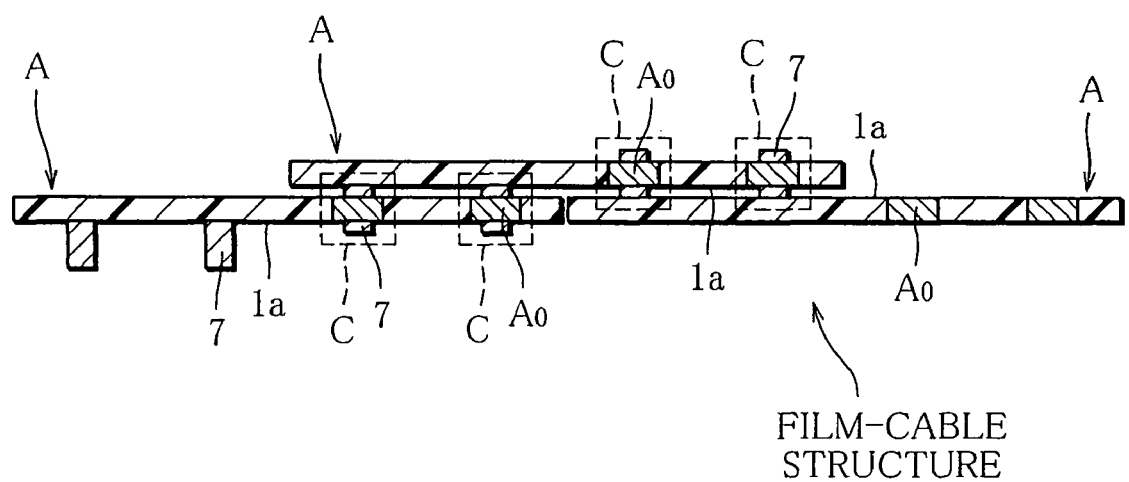
FIG. 33 A cross-sectional view showing an example of a film-cable structure including an electrical connection structure according to the present invention.

FIG. 33 shows an example of a film-cable structure including electrical connection structures C according to the present invention.

In this film cable structure, a plurality (three in FIG. 33) of first connecting members A (long flexible substrates) with female terminals $A_0$ formed in a determined array and with conductive projections 7 formed on a side 1$a$ in the same array are used. Specifically, a cable consisting of the longitudinally connected flexible substrates is formed by inserting the conductive projections (male terminals $B_0$) of one first connecting member A into the female terminals $A_0$ of another first connecting member, thereby forming electrical connection structures C according to the present invention.

In this cable, the height of each connection structure is small. Thus, the cable is very thin and flexible as a whole. When some connecting member breaks, it is possible to restore the cable by disassembling the connection structures C formed by the broken connecting member, manually, at once, and connecting a new connecting member A in place thereof.

(3) Other Assembly Structures

Figure 34:
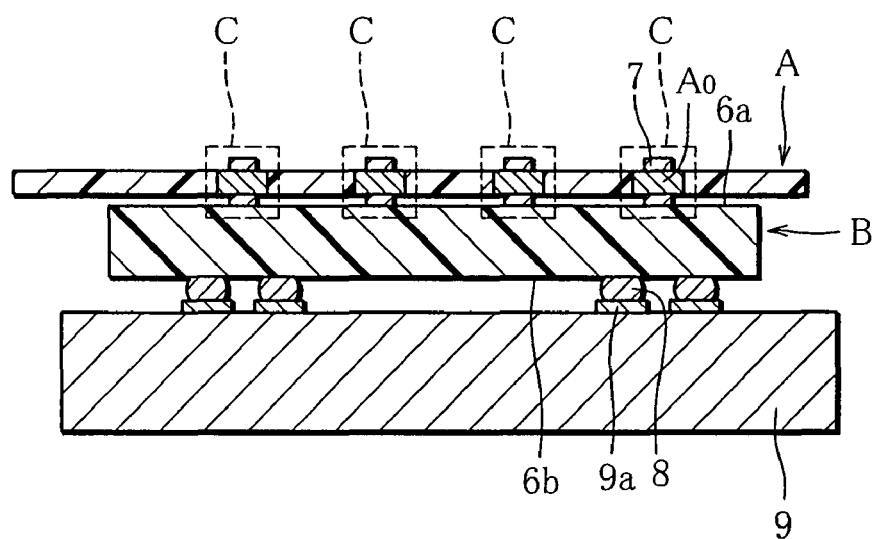
FIG. 34 A cross-sectional view showing an example of a structure including an electrical connection structure according to the present invention.

FIG. 34 shows an example of a structure in which an electronic component including electrical connection structures C according to the present invention is surface-mounted on a circuit board with determined circuit patterns formed on a surface.

In the structure of FIG. 34, there is used a second connecting member B with, for example solder bump electrodes 8 formed on the side 6$b$ opposite to the side 6$a$ with conductive projections 7 formed on.

By inserting the conductive projections 7 of the second connecting member B into the female terminals $A_0$ of a flexible substrate constituting a first connecting member A, electrical connection structures C according to the present invention are formed, and by joining the solder bump electrodes 8 of the second connecting member B to lands 9$a$ on a circuit board 9, for example by a reflow process, the component including the electrical connection structures C is surface-mounted.

In this structure, the connection structures C have a reduced height. Further, for example by arranging the female terminals $A_0$ as well as the conductive projections 7 in a two-dimensional grid-like array, the space occupied by the connection structures can be much reduced. This produces enough space for carrying out surface-mounting onto the circuit board 9, and allows more components to be mounted, compared with the prior art. The first connecting member A is detachable. Thus, by using a film circuit board having a different function for the first connecting member A, the structure can be arranged to perform a different function.

Figure 35:
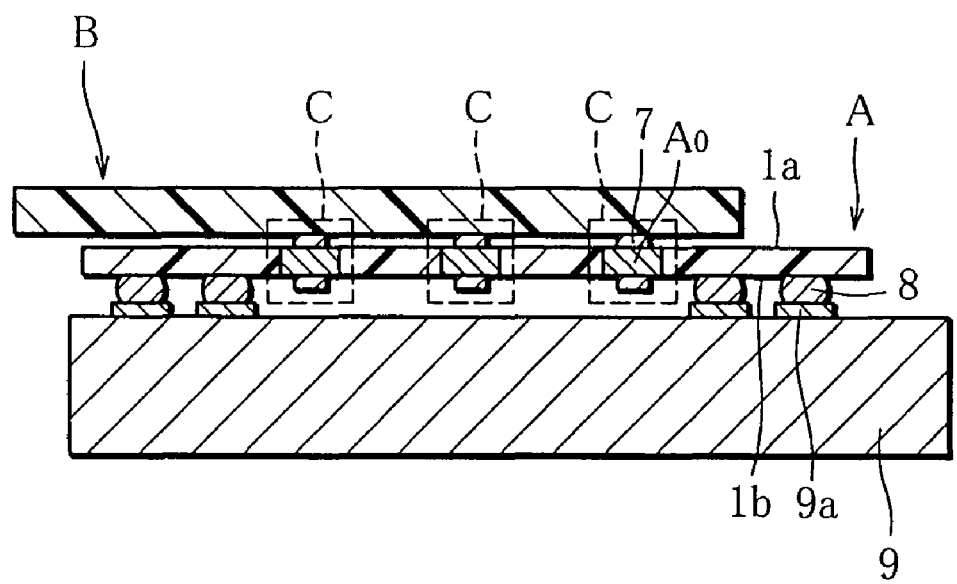
FIG. 35 A cross-sectional view showing another example of a structure including an electrical connection structure according to the present invention.

FIG. 35 shows an example of a structure constructed using a first connecting member A formed of a flexible substrate, in place of the second connecting member B of FIG. 34.

In this structure, there is used a first connecting member A with, for example solder bump electrodes 8 formed on the side 1$b$ opposite to the side with pads formed on. A second connecting member B is a flexible substrate with conductive projections 7 formed on one side. By inserting the conductive projections 7 of the second connecting member B into the female terminals $A_0$ of the first connecting member A, electrical connection structures C according to the present invention are formed, and the whole is surface-mounted on lands 9a on a circuit board 9, using the solder bump electrodes 8.

Figure 36:
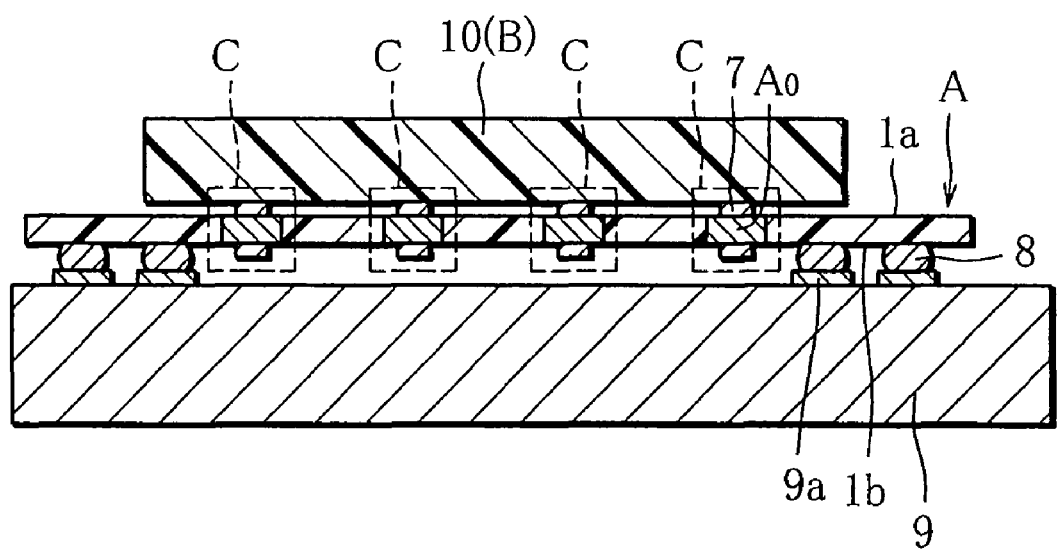
FIG. 36 A cross-sectional view showing another example of a structure including an electrical connection structure according to the present invention.

FIG. 36 shows an example of a structure constructed with an IC chip surface-mounted using electrical connection structures according to the present invention.

In this structure, an IC chip 10 is used as a second connecting member B. A first connecting member A is a flexible substrate with, for example solder bump electrodes 8 formed on the side 1b opposite to the side with pads formed on, as in the case shown in FIG. 35.

Already-described conductive projections 7 for the second connecting member B are formed on one side of the IC chip 10, for example on lands. By inserting these conductive projections 7 into the female terminals $A_0$ of the first connecting member A, electrical connection structures C according to the present invention are formed, and the whole is surface-mounted on lands 9a on a circuit board 9, using the solder bump electrodes 8.

In this structure, the IC chip is detachable. Thus, for example when the IC chip 10 goes out of order, it is possible to detach it and replace it with a new IC chip provided with conductive projections.

Figure 37:
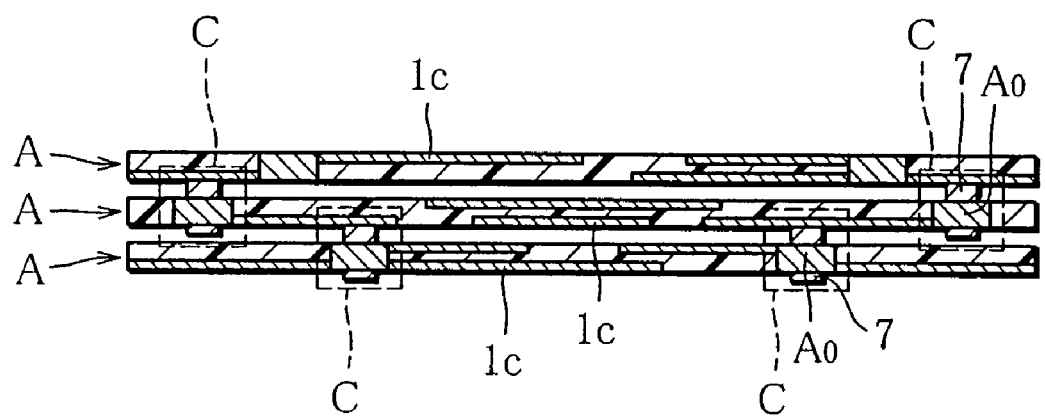
FIG. 37 A cross-sectional view showing an example of a flexible multi-layer circuit board structure including an electrical connection structure according to the present invention.

FIG. 37 shows an example of a multi-layer circuit board structure (three-layer circuit board in FIG. 37) including electrical connection structures C according to the present invention.

This structure is constructed using three first connecting members (flexible substrates) A. Each connecting member A is provided with determined circuit patterns 1c, and is in itself a flexible circuit board. In the structure shown, the two connecting members A (forming the upper two layers) have conductive projections 7 each electrically connected with a circuit pattern 1c, while the connecting member A forming the lowermost layer does not have conductive projections 7.

This structure is constructed by stacking the connecting members A successively by inserting the conductive projection 7 of each connecting member A into the female terminals $A_0$ of the connecting member A below, thereby forming electrical connection structures C according to the present invention.

This structure is a multi-layer circuit board produced by mechanically stacking thin first connecting members A as unit boards. Although the structure shown is a three-layer structure, a multi-layer circuit board consisting of a greater number of layers can be constructed by stacking similar first connecting members A successively.

Each unit board (first connecting member) is detachable. Thus, even if some unit board goes out of order, it is possible to replace it with a new unit board, easily.

Figure 38:
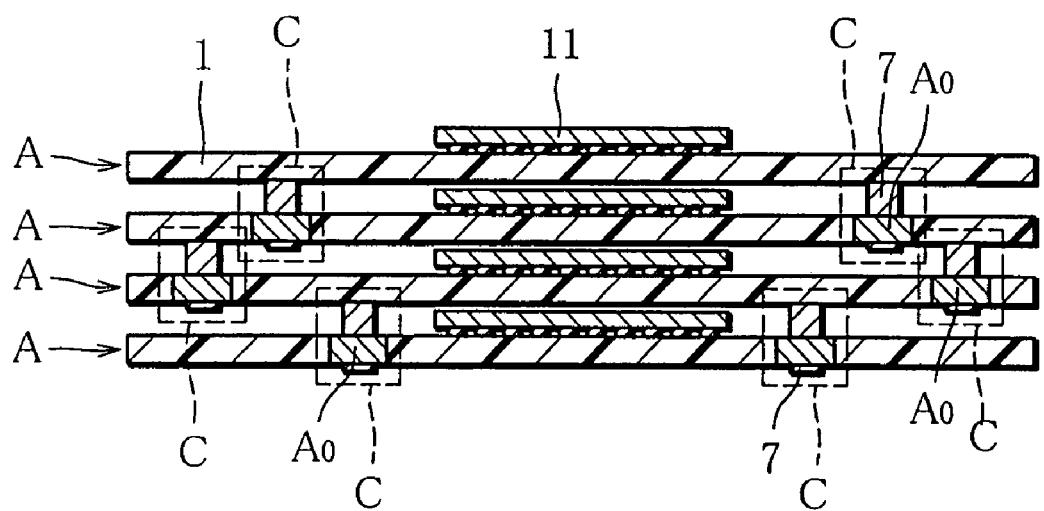
FIG. 38 A cross-sectional view showing an example of a stacked package structure including an electrical connection structure according to the present invention.

FIG. 38 shows an example of a stacked package structure including electrical connection structures C according to the present invention.

Figure 39:
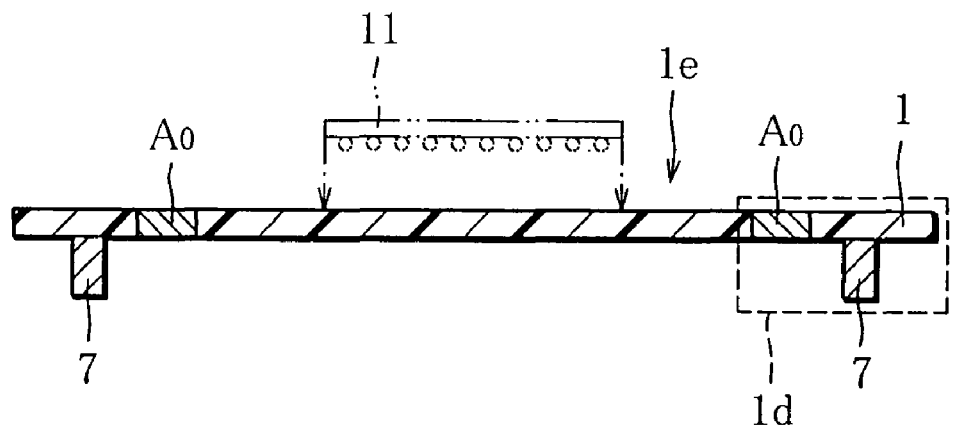
FIG. 39 A cross-sectional view showing an example of a film circuit board used for constructing the stacked package structure of FIG. 38.

This structure is constructed using flexible substrates as shown in FIG. 39. Specifically, each flexible substrate is an insulating film 1 with female terminals $A_0$, each including a pad, and/or conductive projections 7 formed at the periphery 1d, leaving an area for mounting a semiconductor device in the center 1e. As indicated in imaginary line in FIG. 39, a determined semiconductor device 11 is surface-mounted in the center 1e.

The structure of FIG. 38 is constructed by stacking flexible substrates (first connecting members) A as shown in FIG. 39, each with a semiconductor device 11 surface-mounted on, successively, by inserting the conductive projections 7 of each flexible substrate A into the female terminals $A_0$ of the flexible substrate A below, thereby forming electrical connection structures C according to the present invention.

In this structure, each substrate is thin and each connection structure formed has a small height. Thus, the structure as a whole is very thin. Further, by arranging the female terminals $A_0$ as well as the male terminals (conductive projections) 7 in a two-dimensional grid-like array, the space occupied by the connection structures formed by the female and male terminals can be reduced.

Further, even if a semiconductor device on some layer goes out of order, it is possible to remove only the flexible substrate A with the broken semiconductor device surface-mounted on and replace it with a new substrate.

Figure 40:
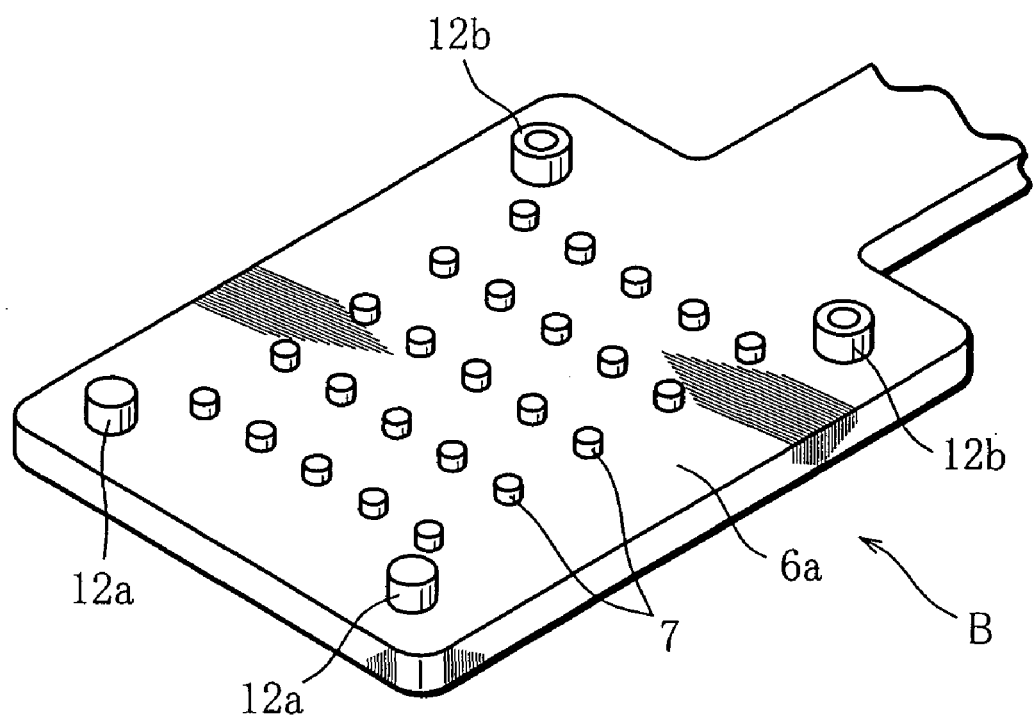
FIG. 40 A perspective view showing an example of the second connecting member.

FIG. 40 shows an example of a second connecting member B for forming electrical connection structures C according to the present invention.

The connecting member B comprises a flexible substrate as a base member, and on a side 6a thereof, conductive projections 7 are arranged in a grid-like array. Further, columnar guides 12a, 12a and hollow columnar guides 12b, 12b are provided at the four corners on the side 6a.

A first connecting member (not shown) intended as a counterpart of this connecting member has female terminals formed in the already-described manner, at the locations corresponding to the conductive projections in the grid-like array, and female guides for receiving the columnar guides and hollow columnar guides, formed at the surface locations corresponding to them.

The intended electrical connection structures are constructed by fitting the columnar guides 12a, 12a and hollow columnar guides 12b, 12b of the connecting member B into the female guides of the first connecting member intended as a counterpart, and then pressing both connecting members against each other, thereby inserting the conductive projections 7 into the female terminals of the first connecting member.

Thus, the provision of the columnar guides and hollow columnar guides to the connecting member B allows the conductive projections to be smoothly aligned with the female terminals. Particularly when the construction of the electrical connection structures is carried out automatically, providing such columnar guides and hollow columnar guides to the connecting member B is desirable.

Figure 41:
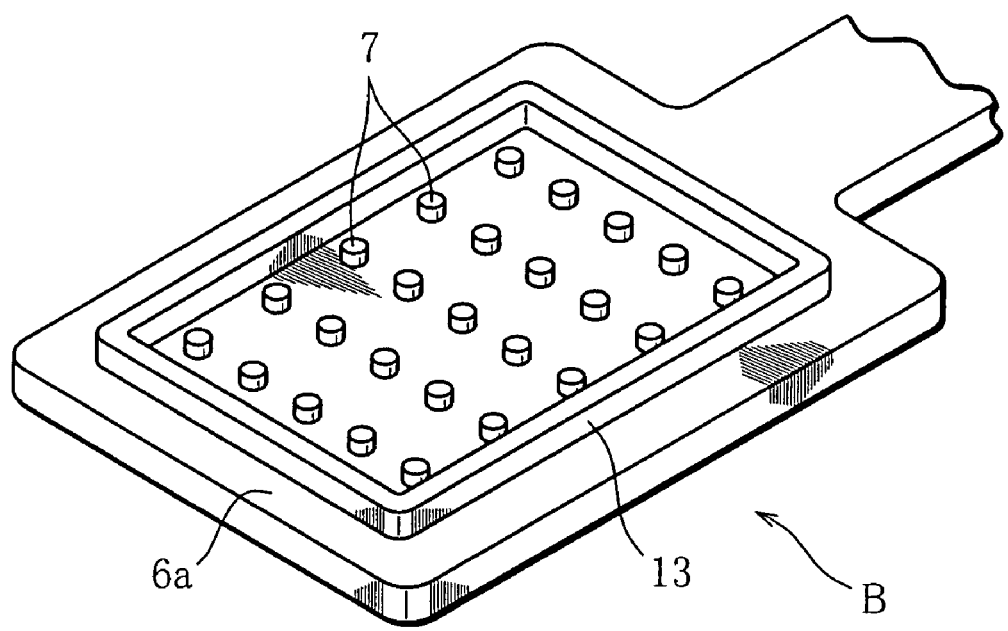
FIG. 41 A perspective view showing another example of the second connecting member.

FIG. 41 shows another example of the second connecting member.

This connecting member is provided with a guide wall 13 surrounding the conductive projections 7 arranged in a grid-like array, in place of the columnar guides and hollow columnar guides of the connecting member shown in FIG. 40. A first connecting member intended as a counterpart has a hollow formed for receiving this guide wall 13.

Also this guide wall 13 functions as a means which allows the connecting members to be aligned with each other smoothly, when connection structures are constructed.

Figure 42:
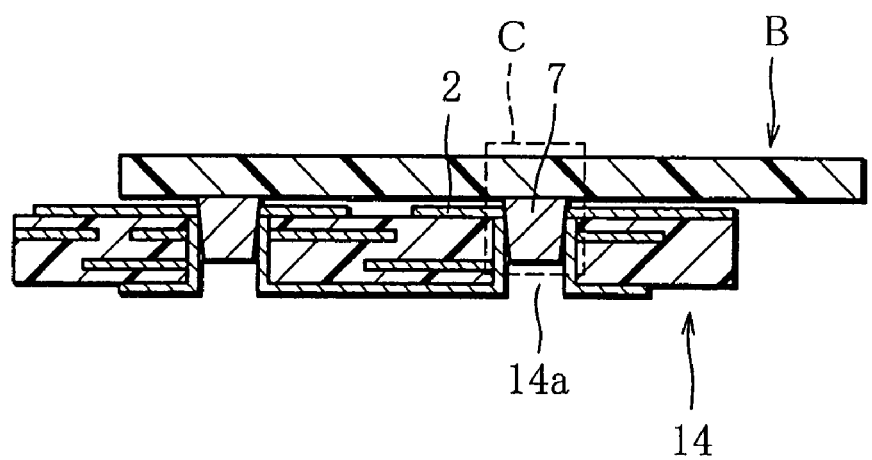
FIG. 42 A cross-sectional view showing an example of a structure using an electrical connection structure according to the present invention.

FIG. 42 shows an example of a structure comprising a second connecting member B formed of a film circuit board with a tapered conductive projection 7 formed on one side, and a circuit board 14 (a rigid printed circuit board or a ceramic substrate, for example) with a through-hole 14a having a wall plated with, for example copper and a pad 2, where the conductive projection 7 is inserted in the through-hole 14a.

In this structure, an electrical connection structure C according to the present invention is formed by the conductive projection 7 placed in the through-hole 14a being in contact with the pad 2, and the film circuit board is detachable.

By using such film circuit board as a second connecting member B and selecting, as a counterpart, a different type of circuit board provided with a through-hole, a variety of structures including an electrical connection structure according to the present invention can be constructed.

INDUSTRIAL APPLICABILITY

The electrical connection structure according to the present invention is formed by mechanically inserting, into an elastic female terminal, a conductive projection formed on a surface of a counterpart to function as a male terminal. The female terminal is formed to a first connecting member formed of a thin flexible insulating film, and a pad constituting the female terminal is formed of an elastic material. Thus, the connection formed by inserting the conductive projection into the female terminal can have a reduced height, compared with the prior art. Further, by arranging the female terminals as well as the male terminals in a two-dimensional grid-like array, the planar space occupied by a multi-pin structure comprising a plurality of electrical connection structures can be much reduced to achieve space-saving. In addition, the first connecting member is detachable.

Thus, by utilizing this electrical connection structure, a variety of structures, such as film-cable structures, extremely thin connector structures, multi-layer circuit board structures with replaceable components, and stacked package structures, can be constructed.

The invention claimed is:

1. An electrical connection structure for forming an electrical connection between a first connecting member and a second connecting member, the first connecting member comprising a flexible substrate comprising a flexible insulating film, a conductive pad having elasticity and formed on at least one side of the flexible insulating film, a conductive circuit pattern extending from a rim of the conductive pad, and a through-hole formed through a thickness of the flexible insulating film at a planar position within the conductive pad, and a small aperture formed at a planar position within the conductive pad and communicating with the through-hole, said small aperture having a contour located within the contour of the through-hole as viewed in a direction of a thickness of the flexible insulating film, the second connecting member comprising a conductive projection formed on at least one side of the second connecting member and electrically connected with a conductive circuit pattern formed inside or on the second connecting member, wherein the electrical connection is formed in a manner such that the conductive projection of the second connecting member is detachably inserted in the through-hole of the first connecting member, from a side of the flexible insulating film upon which the conductive pad is formed, through the small aperture in the conductive pad, thereby elastically bending the conductive pad and a portion of the flexible insulating film under the conductive pad, along a direction of insertion of the conductive projection, so that the conductive pad is pressed onto the conductive projection due to elastic force of the conductive pad and the flexible insulating film is bent.

2. The electrical connection structure according to claim 1, wherein the conductive pad is formed of a material having both conductivity and elasticity.

3. The electrical connection structure according to claim 2, wherein a material which forms the conductive pad comprises copper, nickel, stainless steel, phosphor bronze, Inconel or a conductive resin composition.

4. The electrical connection structure according to claim 1, wherein the small aperture is smaller in cross section than the conductive projection.

5. The electrical connection structure according to claim 4, wherein the small aperture has a circular, polygonal or slit-like planar shape.

6. The electrical connection structure according to claim 1, wherein the first connecting member includes a plurality of conductive pads arranged in a two-dimensional grid-like array and the second connecting member includes a plurality of conductive projections arranged in a two-dimensional grid-like array corresponding to the two-dimensional grid-like array of said plural conductive pads.

7. The electrical connection structure according to claim 1, wherein the conductive projection rises at an angle of 65° to 160°.

8. The electrical connection structure according to claim 1, wherein the conductive projection is greater in cross section at the top than at the base.

9. The electrical connection structure according to claim 1, wherein the second connecting member comprises a flexible substrate having a same structure as the flexible substrate of the first connecting member, and the conductive projection is formed on one or each side of the flexible substrate.

10. The electrical connection structure according to claim 1, wherein the first connecting member further comprises a conductive projection on one or each side of the flexible substrate.

11. The electrical connection structure according to claim 1, wherein a bump electrode is formed on a side of the first connecting member opposite to the side upon which the conductive pad is formed, or on a side of the second connecting member opposite to the side upon which the conductive projection is formed.

12. The electrical connection structure according to claim 1, wherein the second connecting member comprises a same flexible substrate as the first connecting member, and the conductive projection is formed on each of the flexible substrates constituting the first and second connecting members, on a side opposite to the side upon which the conductive pad is formed, wherein the conductive pad and the conductive projection are each located at a periphery of the flexible substrate, leaving an area for mounting a semiconductor device in a center of the flexible substrate.

13. The electrical connection structure according to claim 3, wherein the conductive pad comprises a thin film having a thickness of 0.05 to 100 μm.

14. A first connecting member of an electrical connection structure formed between the first connecting member and a second connecting member that includes a conductive projection, the first connecting member comprising a flexible substrate comprising a flexible insulating film, a conductive pad having elasticity and formed on at least one side of the flexible insulating film, a conductive circuit pattern extending from a rim of the conductive pad, and a through-hole formed through a thickness of the flexible insulating film at a planar position within the conductive pad, and a small aperture formed at a planar position within the conductive pad and communicating with the through-hole, said small aperture having a contour located within the contour of the through-hole as viewed in a direction of a thickness of the flexible insulating film, so that the first and second connecting members are detachably engageable to form an electrical connection by inserting the conductive projection of the second connecting member in the through-hole of the first connecting member, from a side of the flexible insulating film upon which the conductive pad is formed, through the small aperture in the conductive pad, thereby elastically bending the conductive pad and a portion of the flexible insulating film under the conductive pad, along a direction of insertion of the conductive projection, so that the conductive pad is pressed onto the conductive projection due to elastic force of the conductive pad and the flexible insulating film is bent.

15. A second connecting member configured for implementation in the electrical connection structure according to claim 1.

* * * * *